United States Patent [19]

Srinivasan et al.

[11] Patent Number: 5,202,635
[45] Date of Patent: Apr. 13, 1993

[54] RADIO FREQUENCY VOLUME RESONATOR FOR NUCLEAR MAGNETIC RESONANCE

[75] Inventors: Ravi Srinivasan, Philadelphia; Joseph Murphy-Boesch, Lafayette Hills, both of Pa.

[73] Assignee: Fox Chase Cancer Center, Philadelphia, Pa.

[21] Appl. No.: 642,411

[22] Filed: Jan. 17, 1991

[51] Int. Cl.$^5$ ............................................. G01R 33/20
[52] U.S. Cl. ..................................... 324/322; 324/318
[58] Field of Search .............. 324/318, 322, 300, 307, 324/309, 319, 320; 128/653.5

[56] References Cited

U.S. PATENT DOCUMENTS

| | | | |
|---|---|---|---|
| 4,439,733 | 3/1984 | Hinshaw et al. | 324/322 |
| 4,646,024 | 2/1987 | Schenck et al. | 324/318 |
| 4,680,548 | 7/1987 | Edelstein et al. | 324/318 |
| 4,692,705 | 9/1987 | Hayes | 324/318 |
| 4,694,255 | 9/1987 | Hayes | 324/318 |
| 4,737,718 | 4/1988 | Kemner et al. | 324/322 |
| 4,740,752 | 4/1988 | Arakawa et al. | 324/318 |
| 4,783,641 | 11/1988 | Hayes et al. | 333/219 |
| 4,825,163 | 4/1989 | Yabusaki et al. | 324/318 |
| 4,879,515 | 11/1989 | Roemer et al. | 324/318 |
| 4,885,539 | 12/1989 | Roemer et al. | 324/318 |
| 4,887,039 | 12/1989 | Roemer ete al. | 324/318 |
| 4,929,881 | 5/1990 | Yabusaki et al. | 324/318 |
| 4,956,608 | 9/1990 | Dorri et al. | 324/318 |
| 4,992,737 | 2/1991 | Schnur | 324/318 |
| 5,041,790 | 8/1991 | Tropp et al. | 324/318 |
| 5,053,711 | 10/1991 | Hayes et al. | 324/318 |

FOREIGN PATENT DOCUMENTS

| 0303880 | 2/1989 | European Pat. Off. | 324/318 |
|---|---|---|---|
| 2-93387 | 9/1988 | Japan . | |

OTHER PUBLICATIONS

C. N. Chen, D. I. Hoult and V. J. Sank, J. Magn, Reson 54, 324–327 (1983). "Quadrature Detection Coils-A Further Square Root of Two Improvement in Sensitivity".
C. E. Hayes, W. A. Edelstein, J. F. Schenk, O. M. Mueller and M. Eash, J. Magn. Reson. 63, 622–628 (1985). "An Efficient, Highly Homogeneous Radiofrequency Coil for Whole -Body NMR Imaging at 1.5 T".
Alan R. Rath, J. Magn. Reson. 86, 488–495 (1990). "Design and Performance of a Double-Tuned Bird–Cage Coil". Also, ENC, Apr. 1989.
D. I. Hoult and R. E. Richards, J. Magn. Reson. 24, 71–85 (1976). "The Signal-to-Noise Ratio of the Nuclear Magnetic Resonance Experiment".
James Tropp, J. Magn. Reson. 82, 51–62 (1989). "Theory of the Bird–Cage Resonator".
Bottomley et al., Magn. Reson. Med. 7, 319–336 (1988). "Human in Vivo Phosphate Metabolite Imaging with $^{31}P$ NMR".
M. D. Schnall, V. H. Subramanian and J. S. Leigh, Jr., J. Magn. Reson. 67, 129–134 (1986). "The Application of Overcoupled Tank Circuits to NMR Probe Design".
J. Murphy-Boesch et al., Abstract: Society of Magnetic Resonance in Medicine, Eighth Annual Meeting, vol. 2, p. 944, Society of Magnetic Resonance, Berkeley, Calif. 1989.
P. Joseph and D. Lu, IEEE Trans. Med. Imaging 8, 286–294 (1989). "A Technique for Double Resonant Operation of Birdcage Imaging Coils".
(List continued on next page.)

*Primary Examiner*—Michael J. Tokar
*Attorney, Agent, or Firm*—Dann, Dorfman, Herrell and Skillman

[57] ABSTRACT

A radio frequency volume resonator mounted on a generally cylindrical dielectric support can be operated in quadrature at one or more NMR frequencies. The resonator consists of four axially distributed high frequency ring current paths and a dielectric support, at least four high frequency current paths interconnect each pair of adjacent ring paths, at least one discrete capacitor is placed in each current loop but arranged so that none of the ring current paths is interrupted by a capacitor.

50 Claims, 14 Drawing Sheets

OTHER PUBLICATIONS

K. Derby, J. Tropp and C. Hawryszko, J. Magn. Reson. 86, 645–651 (1990). "Design and Evaluation of a Novel Dual-Tuned Resonator for Spectroscopic Imaging".

G. Isaac et al., J. Magn. Reson 89, 41–50 (1990) "A Design for a Double-Tuned Birdcage Coil for Use in an Integrated MRI/MRS Examination".

Donald W. Alderman and David M. Grant, J. Magn. Reson. 36, 447–451 (1979). "An Efficient Decoupler Coil Design which Reduces Heating in Conductive Samples in Superconducting Spectrometers".

V. J. Sank, C. N. Chen and D. I. Hoult, J. Magn. Reson. 69, 236–242 (1986). "A Quadrature Coil for the Adult Human Head".

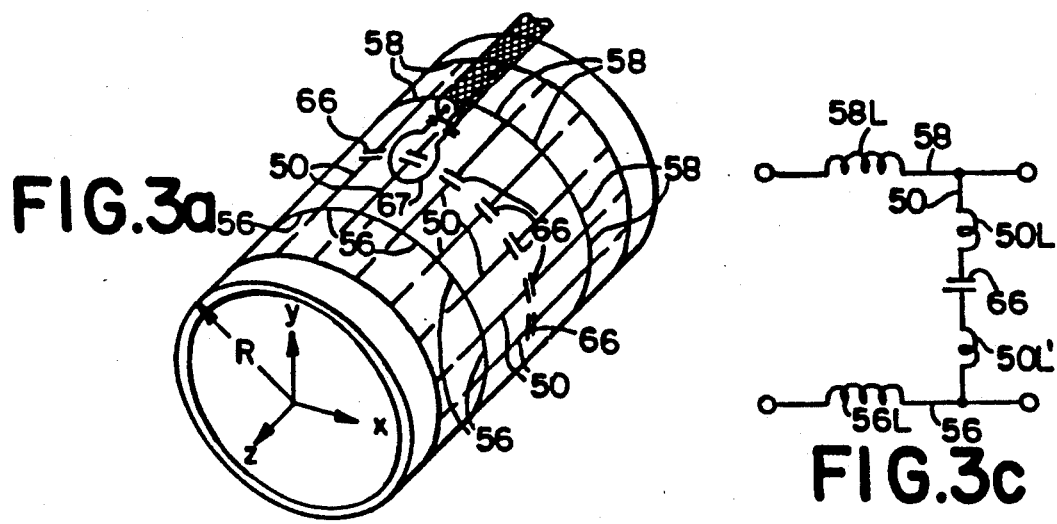
FIG.3a
FIG.3c
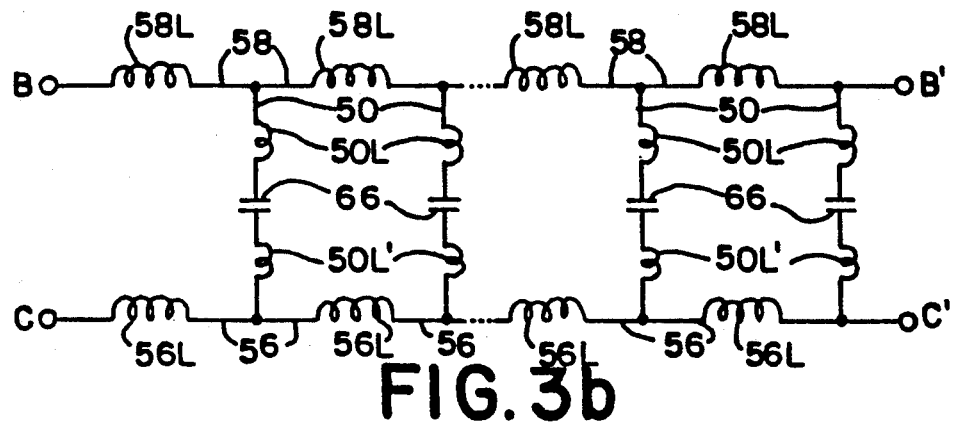
FIG.3b
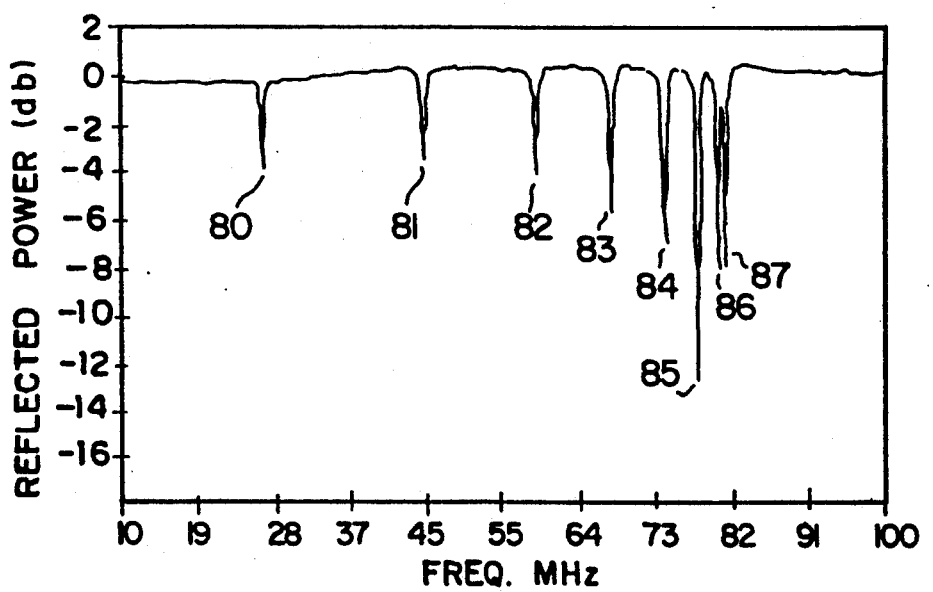
FIG.3d

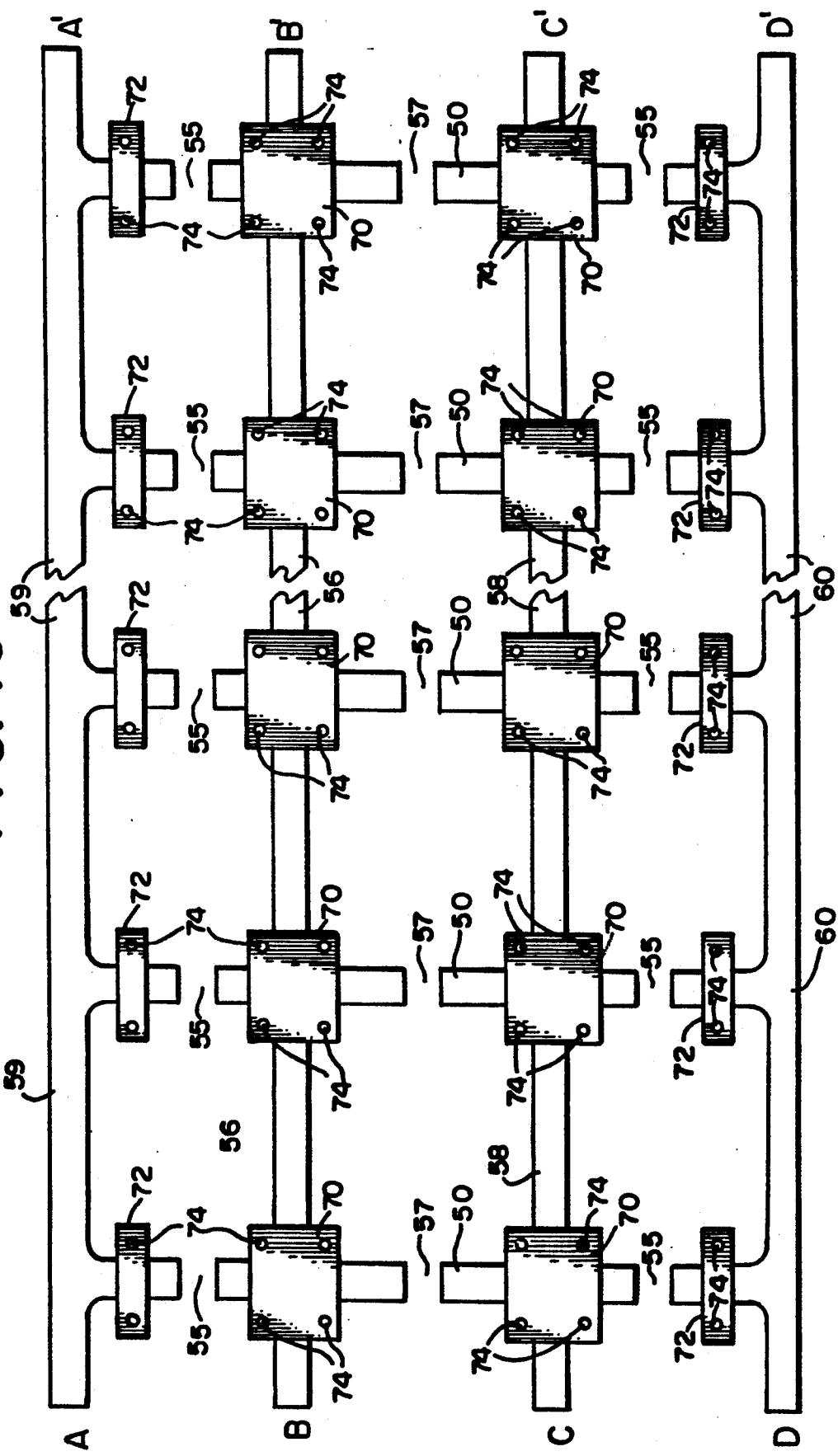

RADIO FREQUENCY VOLUME RESONATOR FOR NUCLEAR MAGNETIC RESONANCE

Pursuant to 35 U.S.C. §202(c) it is hereby acknowledged that the U.S. Government has certain rights in the invention described herein, which was made in part with funds from the National Institutes of Health.

The present invention relates to an improvement in nuclear magnetic resonance (NMR) apparatus and, more particularly, to resonators for transmitting and/or receiving radio frequency (RF) signals characteristic of signals emitted by nuclei in NMR analyses. More specifically, the inventive resonator provides multiple high-frequency current paths for multiple tuning of the coil and for generation of radio frequency flux at each NMR frequency. Reduced circuit interactions between NMR frequencies permit rapid tuning and alignment of the linear modes of the resonator. Further, the invention relates to simultaneous operation of the resonator in circularly polarized mode at all NMR frequencies.

The present invention is part of a family of inventions, two of which are pending as U.S. patent applications Ser. No. 561,898 filed Aug. 2, 1990 and Ser. No. 603,947 filed Oct. 25, 1990.

BACKGROUND OF THE INVENTION

The NMR technique is based upon the magnetic properties of nuclei containing odd numbers of protons and neutrons. These nuclei possess an angular momentum related to the charge thereof. The magnetic moment is directed along the spin axis of each nucleus. When placed in a strong and generally homogeneous static magnetic field, designated $B_o$, the nuclei either align with or against the applied field and precess with a common sense about the applied field. The precessional angle of a nucleus may be changed by absorption of electromagnetic energy through a phenomenon known as nuclear magnetic resonance, NMR, which involves impressing upon the nuclei a second rotating magnetic field, designated $B_1$, of frequency to match that of their normal precession. When the applied RF magnetic field is removed, the nuclei precess and relax toward their equilibrium conditions, generating radio frequency signals characteristic of the molecular environments in which the nuclei reside. The frequency at which they precess is known as the Larmor frequency and is given in angular frequency by $\omega = \gamma B$. $\gamma$, the gyromagnetic ratio, is a constant for each nucleus or nuclear isotope and generally results in widely separated Larmor frequencies for a given applied field strength, $B_0$. B is the magnetic field acting on the nuclei and is modified by the molecular environment of a nucleus according to $B = B_0(1-\delta)$. $\delta$ is the chemical shift offset impressed upon chemically equivalent nuclei by the local electronic distribution. Measured usually in parts per million, chemical shifts of a particular nucleus or nuclear isotope produce much smaller differences in frequency, and spectra derived from them can be used to obtain quantitative, structural, and dynamic information about the molecules of a sample. In another configuration, a bias or gradient in the normally homogeneous $B_0$ field is introduced across the sample for the purpose of spatially encoding information into the NMR signals. Images are later reconstructed from the information contained within this data, forming the basis of NMR imaging, a technique now widely used in medical diagnostics. Because the Larmor frequency is proportional to the applied field $B_0$, local resonance frequencies will vary across the sample according to the strength of the magnetic field. It is only with technical difficulty that homogeneous $B_0$ fields are obtained, and high-field magnets are usually provided with electronic shim coils to counter both residual distortions of the magnet and the susceptibility distortions from sample or tissue being investigated and from materials comprising NMR probe. Acquisition of highly resolved spectra from a sample is usually preceded by a "shimming" procedure using a high sensitivity NMR signal from hydrogen protons or another abundant nucleus. In very high-field spectroscopy, the stability of the magnetic field is further maintained by electronically comparing the frequency of an NMR signal derived from a separate nucleus, typically deuterium, with that of a stable RF oscillator and engaging a field sweep coil in the feedback loop of the field stabilization circuit.

The $B_1$ field for transmitting to the sample is derived most efficiently from a resonant radio frequency (RF) coil placed in proximity to the sample and connected to the RF transmitting apparatus. Either the same or a second RF coil may be connected to the RF receiving apparatus to receive the NMR signals, which are induced in the coil by the precessing magnetism of the nuclei. Free induction signals from chemically shifted nuclei and from samples with field gradients impressed upon them are normally received with a single-resonant coil tuned to the Larmor frequency of the nucleus. Transmitting to and receiving NMR signals from two different nuclei or nuclear isotopes, however, generally require use of two coils each single tuned or a single coil doubly tuned to the individual Larmor frequencies. The lossy circuit elements in double-tuned, single coil probes necessarily make them less sensitive than their single-tuned counterparts. Considerable care must be exercised to maintain maximal sensitivity at each frequency, and maximal sensitivity at one frequency is frequently achieved at the cost of less sensitivity at the other. Improved sensitivity and a reduction in transmitter power can be obtained if a coil can be operated in circularly polarized mode. See C.–N Chen, D. I. Hoult, and V. J. Sank, J. Magn. Reson. 54, 324–327 (1983). A linear oscillating field, such as produced by a simple resonant coil, can be cast as the sum of two circularly polarized components of equal amplitude. Likewise, by combining the linearly oscillating fields of two well-isolated single-tuned coils or the well-isolated fundamental modes of a multi-modal structure such as the "birdcage" coil (see Hayes et al., J. Magn. Reson., 63, 622–628 (1985)), a single, circularly polarized magnetic field can be produced which matches the precessional motion of the nuclei. Circularly polarized coils are similar to crossed-coil double-tuned probes in that two resonant circuits require tuning. They differ, however, in that being of the same frequency, they require a high degree of electrical isolation to operate independently.

Many clinical applications of NMR spectroscopy find their origins in conventional high-field chemical NMR spectroscopy. Dual and triple tuned probes are employed wherein one channel, tuned typically to deuterium, is used for shimming and field stabilization of the magnet. The NMR signal is derived from a small amount of typically deuterated solvent added to the sample. In another application involving acquisition of spectra from "X-nuclei," that is, nuclei other than protons having lower frequencies, lower abundances, and consequently lower sensitivity, the sensitivity of these nuclei can be enhanced via the Nuclear Overhauser Effect (NOE) and decoupling of proton spins by irradiating the sample with a modulated signal at the proton frequency. The NOE increases the polarization of X-nuclei by transferring it from the proton spin population, which by virtue of its higher frequency exhibits greater polarization. Finally, heteronuclear experiments are employed wherein RF pulses are applied simultaneously or at alternating intervals to the populations of two nuclei to derive chemical bond and other information related to spins that are proximate to one another. One class of these experiments termed "indirect" experiments, relies upon the greater sensitivity of the protons signal to yield structural and dynamic information about much lower abundant and less sensitive nuclei.

In performing medical NMR spectroscopy, the NMR instrument is generally configured to observe a single nucleus such as hydrogen protons (1H), phosphorus-31 (31P), or carbon-13 (13C). Since phosphorus containing metabolites are key indicators of the state of tissue, considerable effort has been directed towards acquiring and analyzing phosphorus spectra from tissue. Acquisition of high sensitivity phosphorus and other spectra from human tissue is presently being investigated as a technique for identifying and characterizing tissues and following their response to treatment. For the human brain, in particular, a birdcage coil of reduced axial length has been developed for improved sensitivity (see U.S. Pat. No. 4,885,539). The coil, owing to its reduced length, provides an improvement in circuit Q by reducing RF eddy current losses in normally highly conductive tissue. The patient examination is complicated, however, first by the need to shim the static magnetic field, $B_0$, using the hydrogen proton resonance from tissue and, second, the need to acquire proton images of the patient for later correlation of spectral data with the patient anatomy. Typically, a separate coil tuned to the proton frequency is employed for shimming and imaging, and is subsequently replaced with the phosphorus coil for acquisition of in vivo spectra. It is apparent that removal of the patient from the magnet during the exam is unnecessary with a coil which is dual tuned for both frequencies. Patient exam time is therefore reduced. An additional benefit of a dual tuned resonator is the ability to perform proton decoupling by transmitting a suitable decoupling waveform at the second, proton frequency. Proton decoupling improves the resolution and sensitivity of X-nuclei by averaging and effectively removing the coupling between the different nuclear spins. Decoupling efficiency increases with increased transmitted power. At a $B_0$ field of 1.5 Tesla, however, the power deposition from head coils operating in linear mode approaches acceptable limits set forth in FDA guidelines. Power deposition will increase with $B_0$ field, owing to the greater losses in tissue at higher frequency. It is therefore apparent that operation of the proton channel of a dual tuned resonator in circularly polarized mode can reduce power deposition and/or improve decoupling efficiency.

Implementation of a dual tuned resonator operating simultaneously in circularly polarized (CP) mode at both frequencies has not been possible using existing methods. In attempting to implement dual tuned CP volume resonators, reactive elements have been incorporated into the conductors of normally single-tuned birdcage coils to make them doubly resonant. See A. R. Rath, J. Magn. Reson., 86, 488–495 (1990). With capacitors chosen to be less lossy than the inductors of the coil, the low frequency mode suffers a greater loss in efficiency when compared with the performance of its single-tuned counterpart. It is a further feature of this method of double tuning that additional inductors do not contribute substantially to the generation of the RF magnetic field, $B_1$, in the sample at either frequency. Because of the strong interaction between tuning elements, these resonators exhibit complex tuning, matching and mode alignment problems at both NMR frequencies. The process of tuning, matching and mode alignment at both frequencies is an iterative one with iteration not necessarily leading toward the optimal outcome. Thus, true simultaneous operation of these dual tuned resonators in circularly polarized mode has not yet been possible.

SUMMARY OF THE INVENTION

The present invention has a primary purpose to provide a volume resonator capable of operating simultaneously or sequentially in quadrature, or circularly polarized mode, at two selected NMR frequencies.

Various modes of operation are contemplated in which the resonator is operated simultaneously at two or more NMR frequencies, i.e., for two or more separate but naturally occurring nuclei. With the present invention, it is possible to obtain proton (1H) images of the patient during a spectroscopic examination. It is also possible with straightforward modifications to the instrument hardware to acquire spectroscopy data at two frequencies, e.g., from both $^1H$ and $^{31}P$ nuclei during the spectroscopy portion of the exam without requiring the patient to be moved. Another way of operating dual frequency resonator is to use the $^1H$ channel of the coil for what is called "proton decoupling". When a prescribed decoupling waveform is delivered to the resonator at the proton frequency, many of the phosphorus signals emanating from phosphorus-proton containing metabolites in tissue exhibit improved sensitivity both in the strength and sharpness of the signals.

The advantages of the resonator of the present invention may be summarized as follows:

(1) Operation of the resonator at two frequencies for both sequential and simultaneous acquisition of NMR data from two nuclei.

(2) A more efficient operation of the resonator in that the plurality of conductors employed to construct the coil also provide substantially a homogeneous radio frequency magnetic field along the cylindrical axis of the resonator to excite and detect the second nucleus ($^1H$).

(3) Reduced circuit interactions between the two NMR frequencies, allowing the fundamental or K=1 modes at each frequency to be individually tuned and matched.

(4) Reduced circuit interactions between the two NMR frequencies, allowing the fundamental or K=1 modes at each frequency to be individually spatially aligned.

(5) Improved sensitivity or signal-to-noise ratio of received signals from either nucleus in that both channels are operated in circularly polarized (spatial quadrature) mode.

(6) Reduced transmitter power requirements when operating the resonator in circularly polarized mode at either frequency.

(7) Homogeneous radio frequency or $B_1$ field about the axis of the resonator afforded by the sinusoidal distribution of currents around the periphery of the coil in circularly polarized mode.

Thus, these resonators are to be useful in both the clinical and high-field research environments. The dual radio frequency resonator is presently used in clinical spectroscopy studies of the head and extremities. In the high-field research environment, it is expected to have early application to large volume samples, especially in vivo studies of perfused blood cells and tissues. In reduced scale designs there will be early use with 5 mm and 10 mm sample tubes. Later is expected application in very high field, high-resolution spectroscopy probes, such as the currently available 600 MHz instrument.

More specifically the present invention relates to a dual radio frequency volume resonator of generally cylindrical form for use in NMR. The coil of the resonator has four high frequency ring current paths. The coil also has three sets of generally parallel paths, each set being equally spaced from one another. Adjacent paths and adjacent rings thereby form current loops. At least one discrete capacitor is interposed in and interrupts each loop, whereby in combination with the inductance in each loop, including inherent inductance in conductors, resonant frequency loops are formed. The loops between the inner and outer rings repeat about the axis of the cylinder with the first loops joining to the last to form a multi-resonant structure. Two quadrature modes of the structure provide homogeneous RF $B_1$ fields for use at two NMR frequencies.

DRAWINGS

For a better understanding of the present invention reference is made to the following drawings:

FIG. 3a is a schematic diagram showing for analysis the capacitors of only the inner loops of the structure of FIG. 2a functioning as a low-pass volume resonator capable of operating independently;

FIG. 3b is a portion of the developed schematic equivalent circuit of the cylindrical resonator meshes of FIG. 3a;

FIG. 3c is an individual repetitive circuit unit of the circuit of FIG. 3b;

FIG. 3d is a plot of reflected power vs. frequency response of the circuit of FIGS. 3a-3c with the coupling inductive loop placed over the low-pass portion of the resonator shown in FIG. 3a;

Figure 2A:
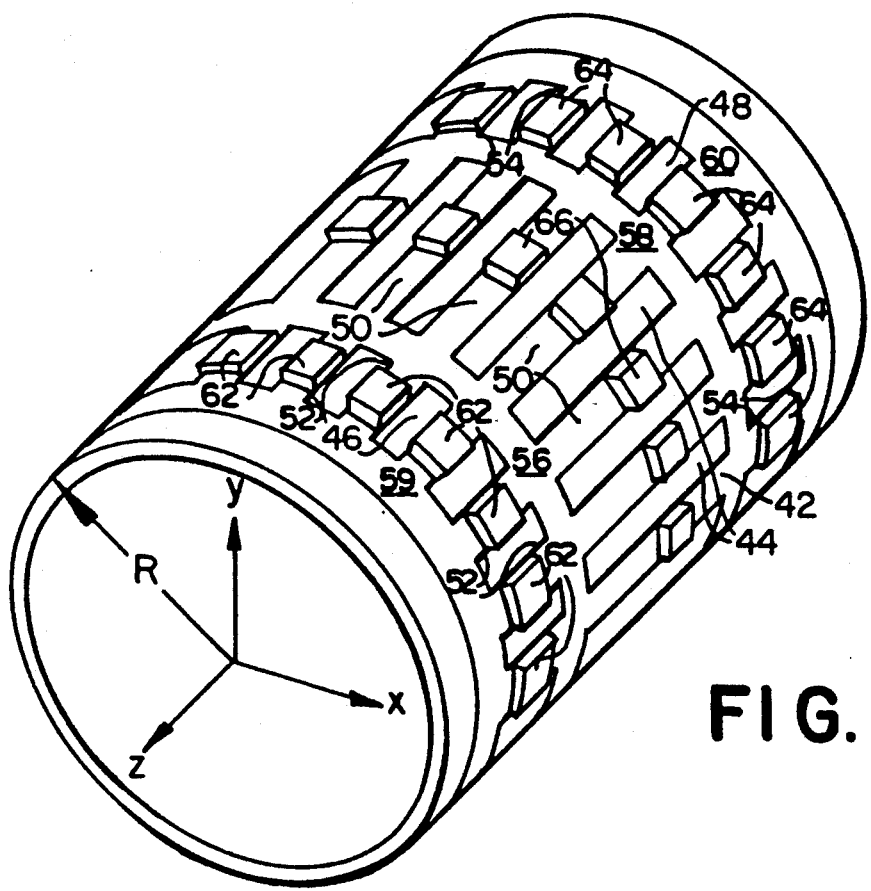
FIG. 2a is a perspective view of a preferred physical embodiment of an NMR Dual RF resonator in accordance with the present invention.
Figure 2B:
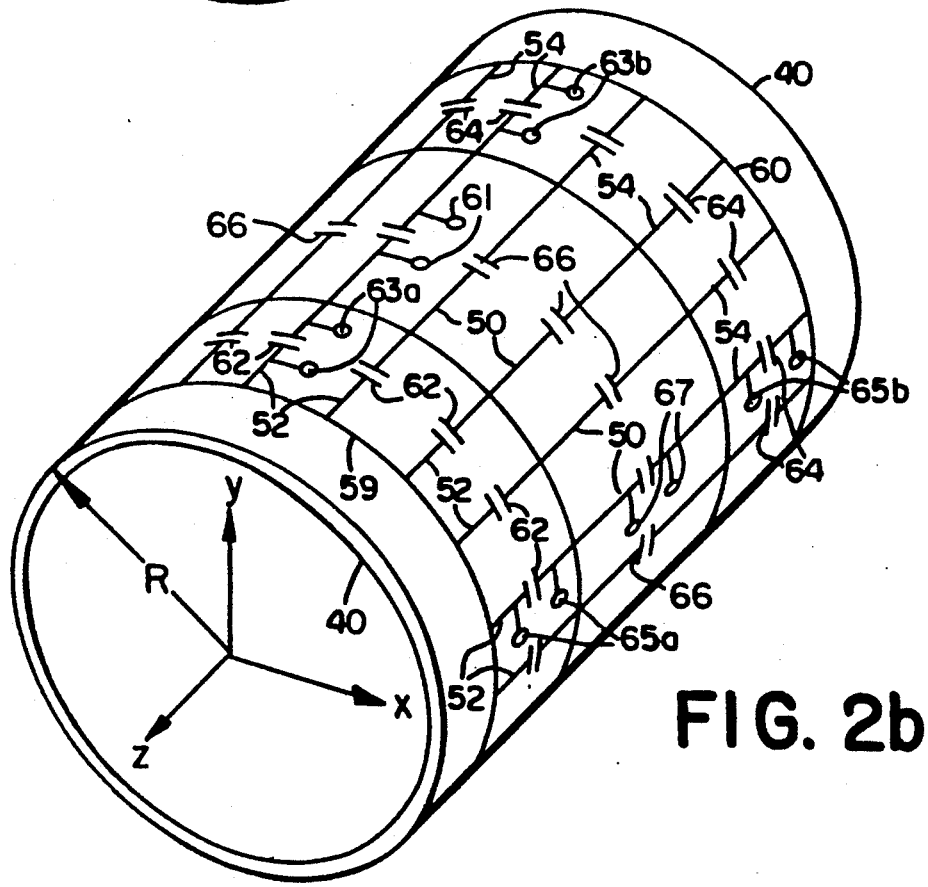
FIG. 2b is a similar view of the resonator of FIG. 2a as a schematic circuit, but showing the location of capacitors and input/output capacitive coupling points.
Figure 4A:
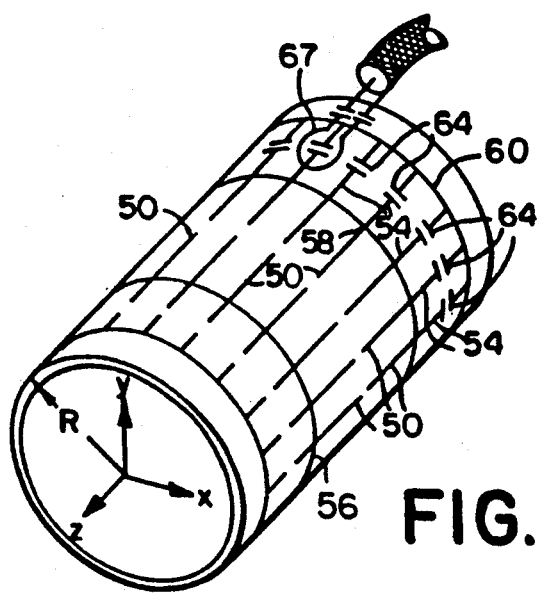
Figure 4C:
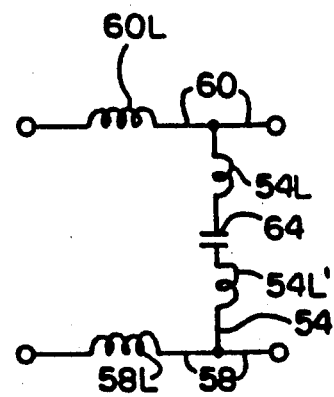
Figure 4B:
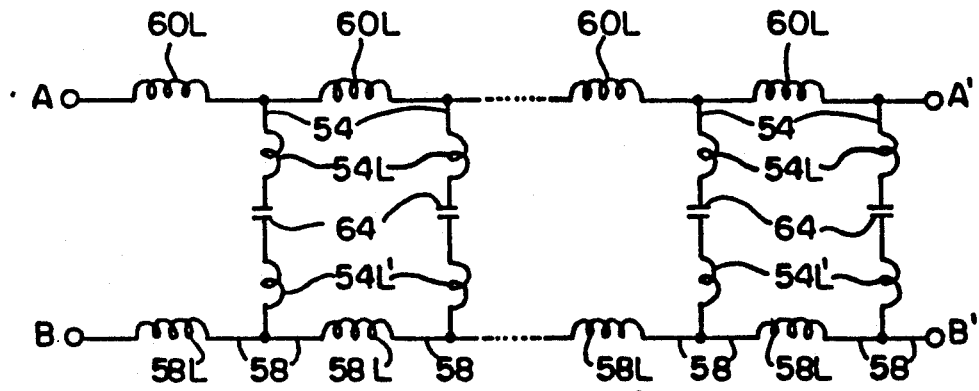
Figure 4D:
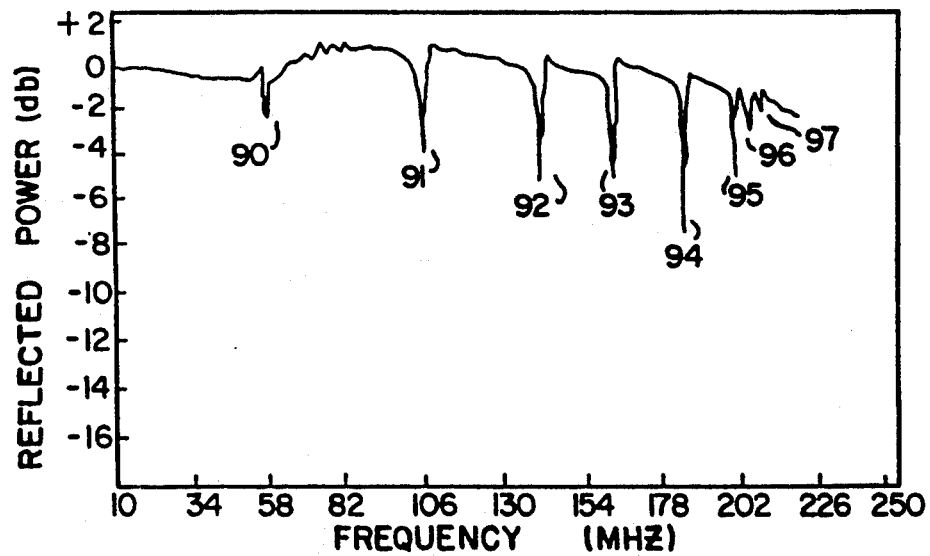
Figure 5A:
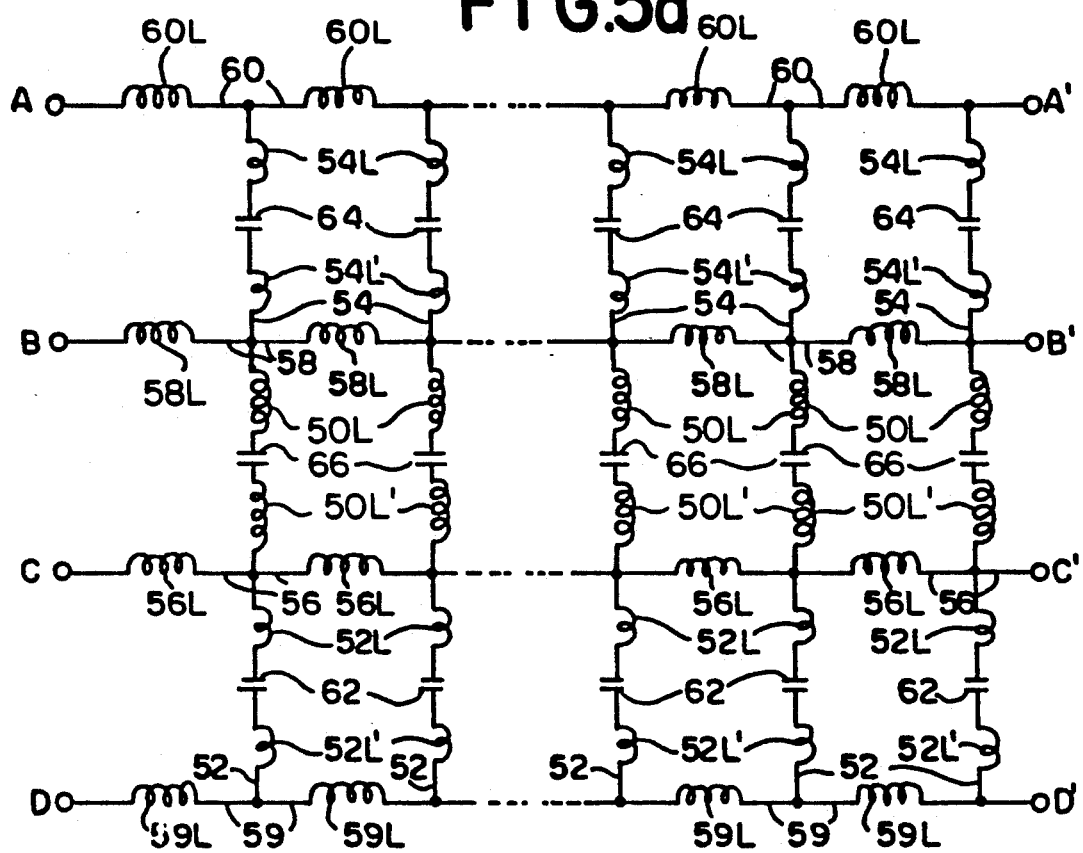
Figure 5B:
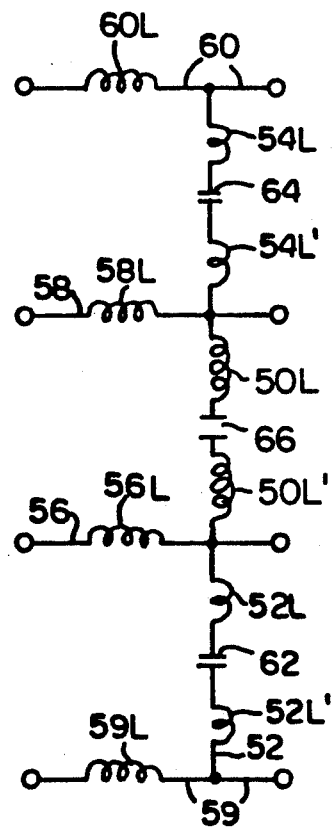
Figure 5C:
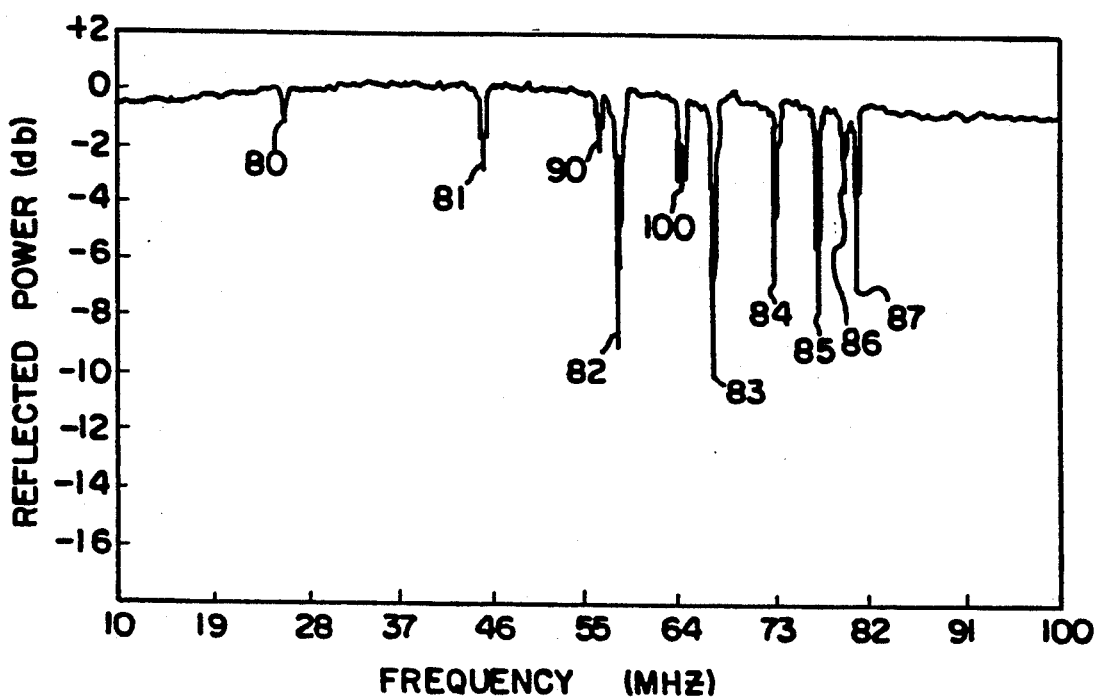
Figure 5D:
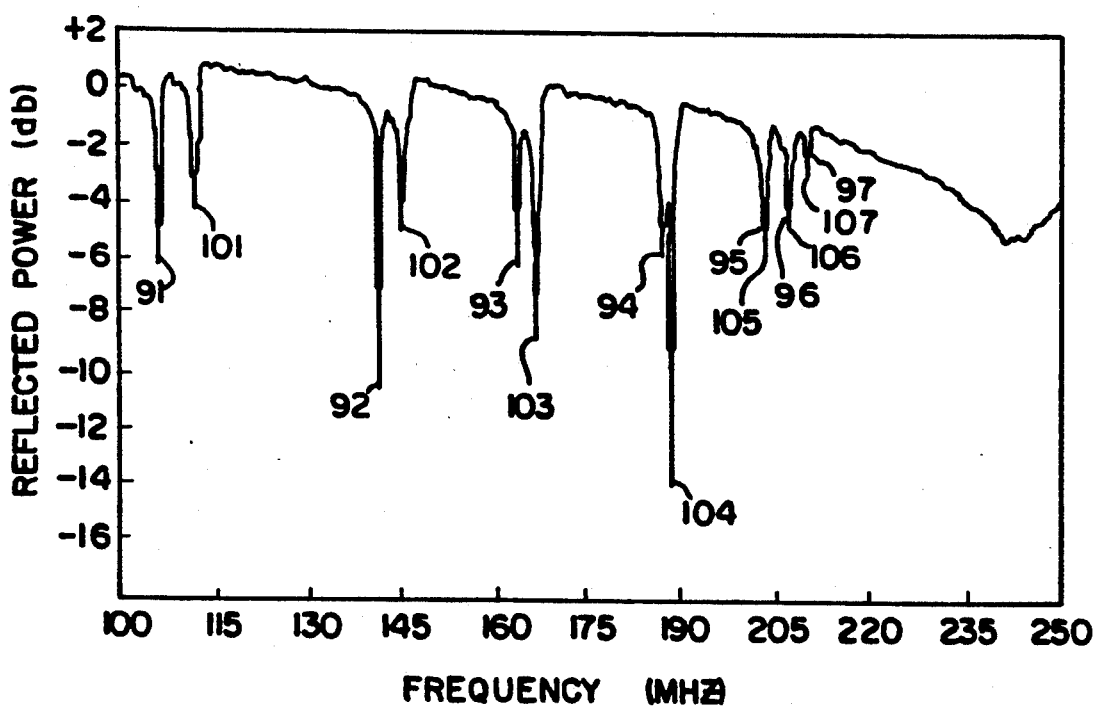
Figure 5E:
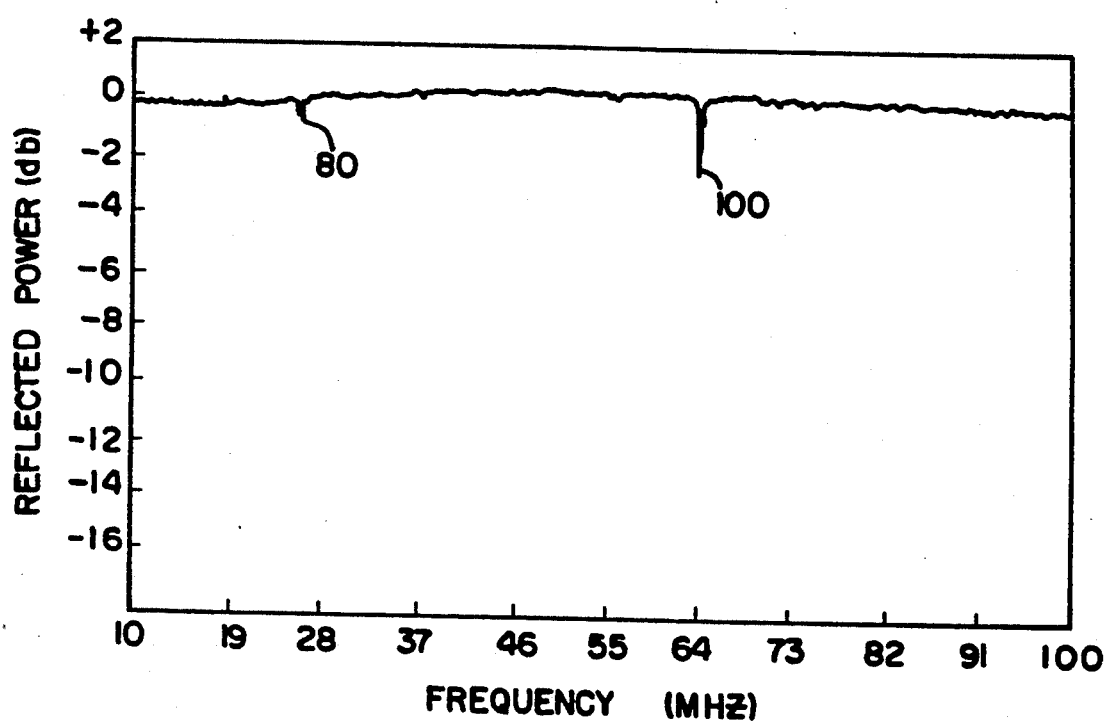
Figure 6A:
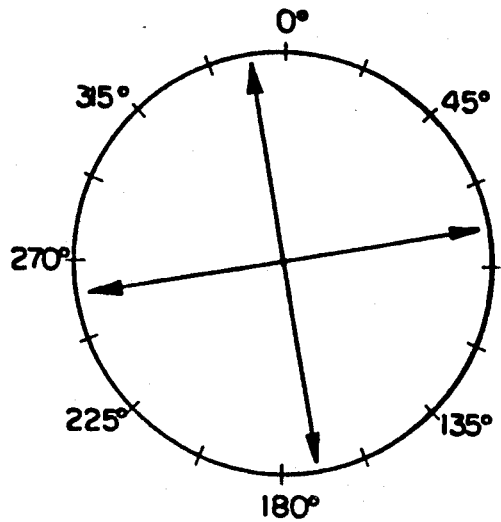
Figure 6B:
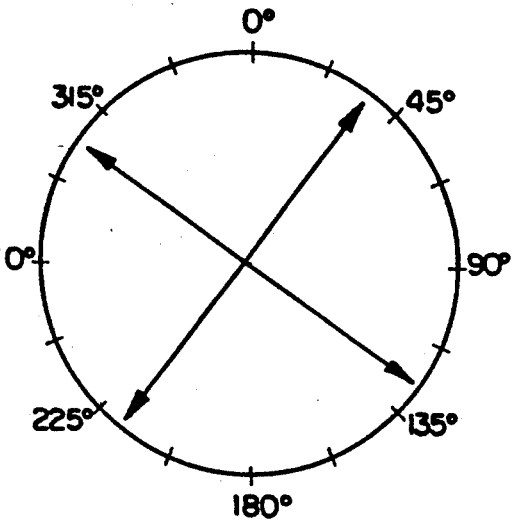
Figure 7A:
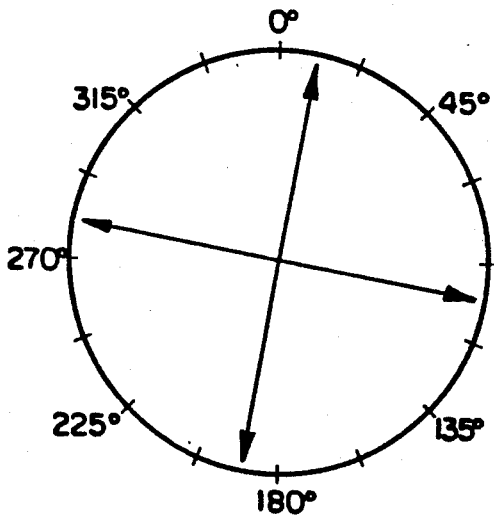
Figure 7B:
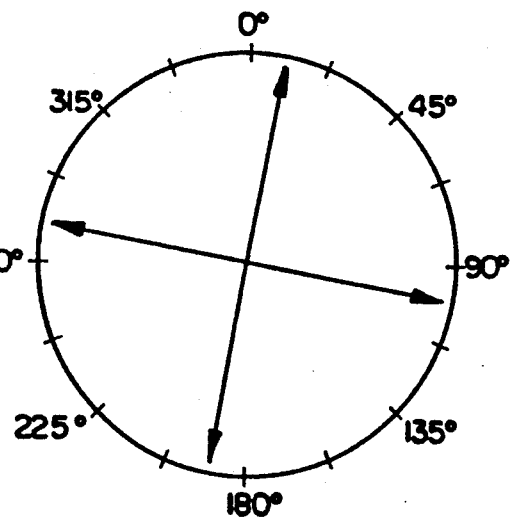
Figure 8A:
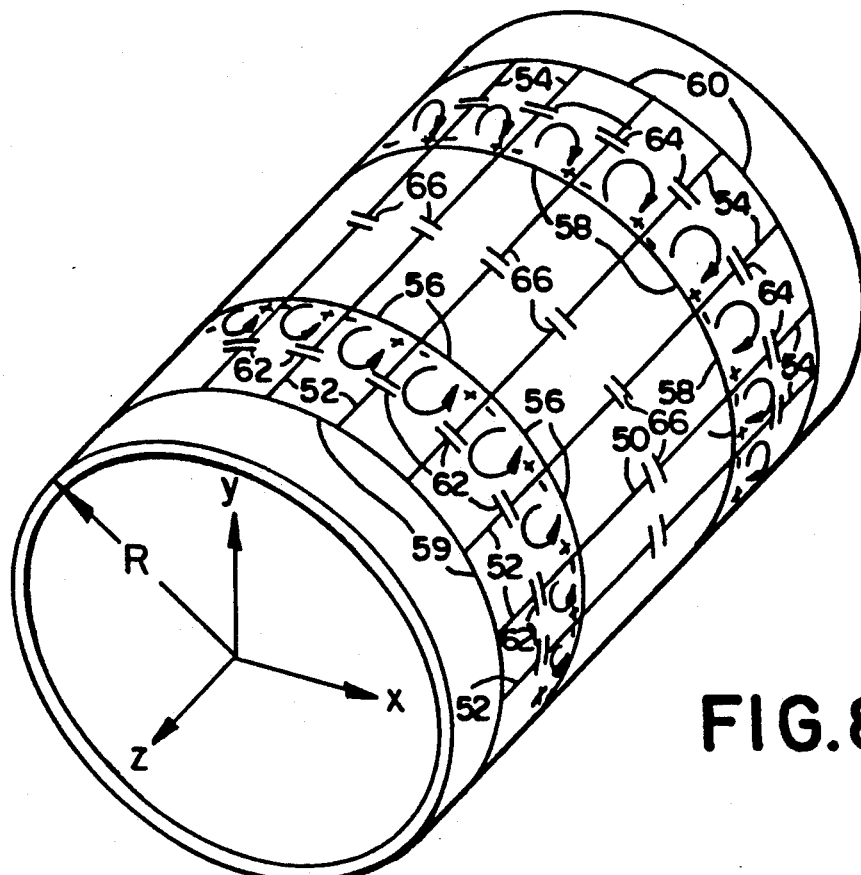

FIGS. 4a-4c correspond to FIGS. 3a-3d but are schematic circuits for one of the outer low-pass structures of the resonator capable of operating independent;

FIG. 4d is a plot of reflected power vs. frequency in the circuit of FIGS. 4a-4c with the coupling inductive loop placed over one of the outer low-pass portions of the resonator shown in FIG. 4a;

FIG. 5a is a portion of the developed schematic for the total dual RF volume resonator shown schematically in FIG. 2b, including all capacitors in the structure;

FIG. 5b is an individual repetitive circuit unit of the circuit of FIG. 5a;

FIG. 5c and FIG. 5d are plots of reflected power vs. frequency response of the circuit of FIGS. 5a and 5b using an inductive coupling loop placed over both the inner and one outer structure;

FIG. 5e is a plot of reflected power versus frequency for the same circuit using an inductive coupling loop placed in the physical center of the volume resonator;

FIG. 6a shows, for example, the orientation of the two "X" and "Y" linear K=1 modes 90 of one of the two outer low-pass resonators of FIGS. 4a-4d capable of operating near 56 MHz;

FIG. 6b shows, for example, the orientation of the two "X" and "Y" linear K=1 modes 90 of the second outer low-pass resonator capable of operating near 56 MHz;

FIG. 7a shows the orientation of the fundamental counter-rotating "X" and "Y" linear modes 90 of the two outer low-pass volume resonator resulting from the outer structures of FIGS. 6a and 6b strongly coupled through the inner low-pass structure and operating near 56 MHz;

FIG. 7b shows the orientation of the fundamental co-rotating "X" and "Y" linear modes 100 of the two outer low-pass volume resonators resulting from the outer structures of FIGS. 6a and 6b strongly coupled through the inner low pass structure, and operating independently near 64 MHz;

FIG. 8a illustrates the sinusoidally distributed counter-rotating currents of the outer structures and the resulting electric potentials of similar polarity developed therein across the inner low pass structure due to the currents in the two outer low-pass resonators.

Figure 8B:
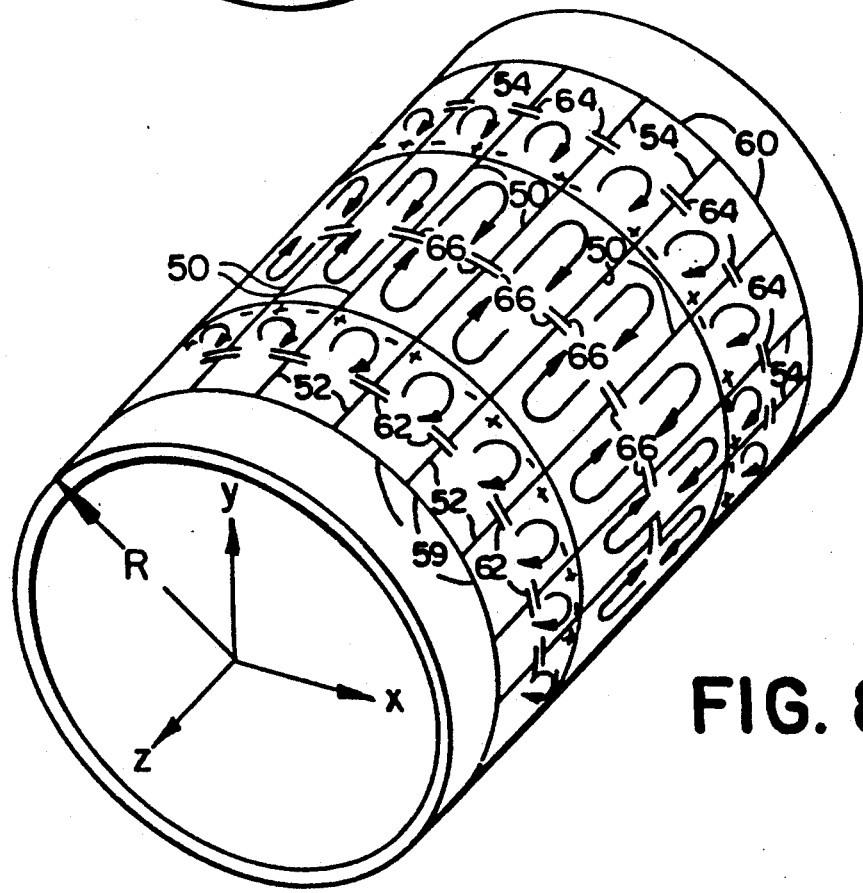

FIG. 8b illustrates the sinusoidally distributed co-rotating currents of the outer structures and the electric potentials of opposite polarity developed therein across the inner low pass structure thereby allowing current to flow across the conductive segments of the inner low pass structure.

Figure 9A:
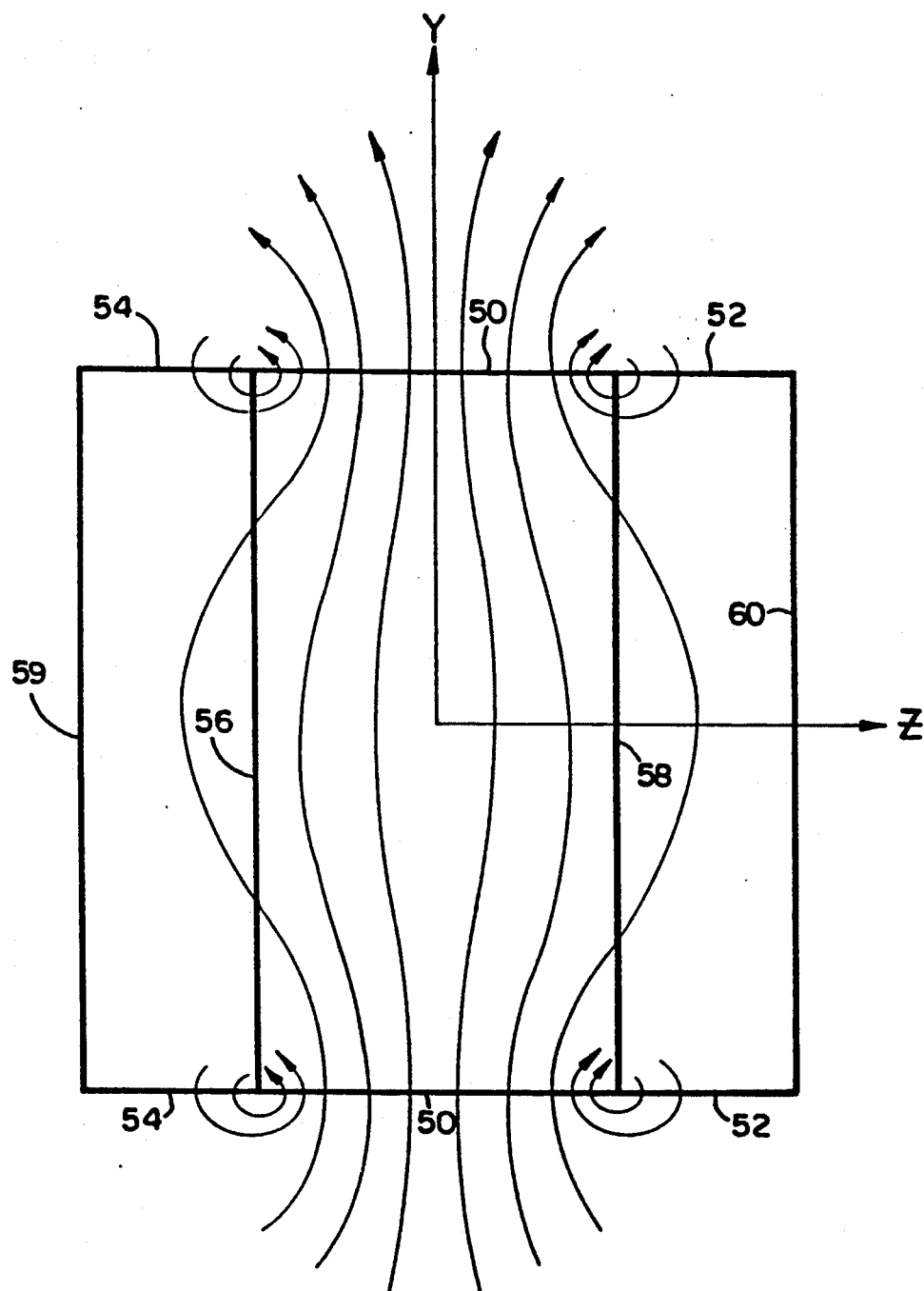

FIG. 9a is a plot of the radio frequency flux lines of the inner resonant structure in a plane through the longitudinal axis of the coil.

Figure 9B:
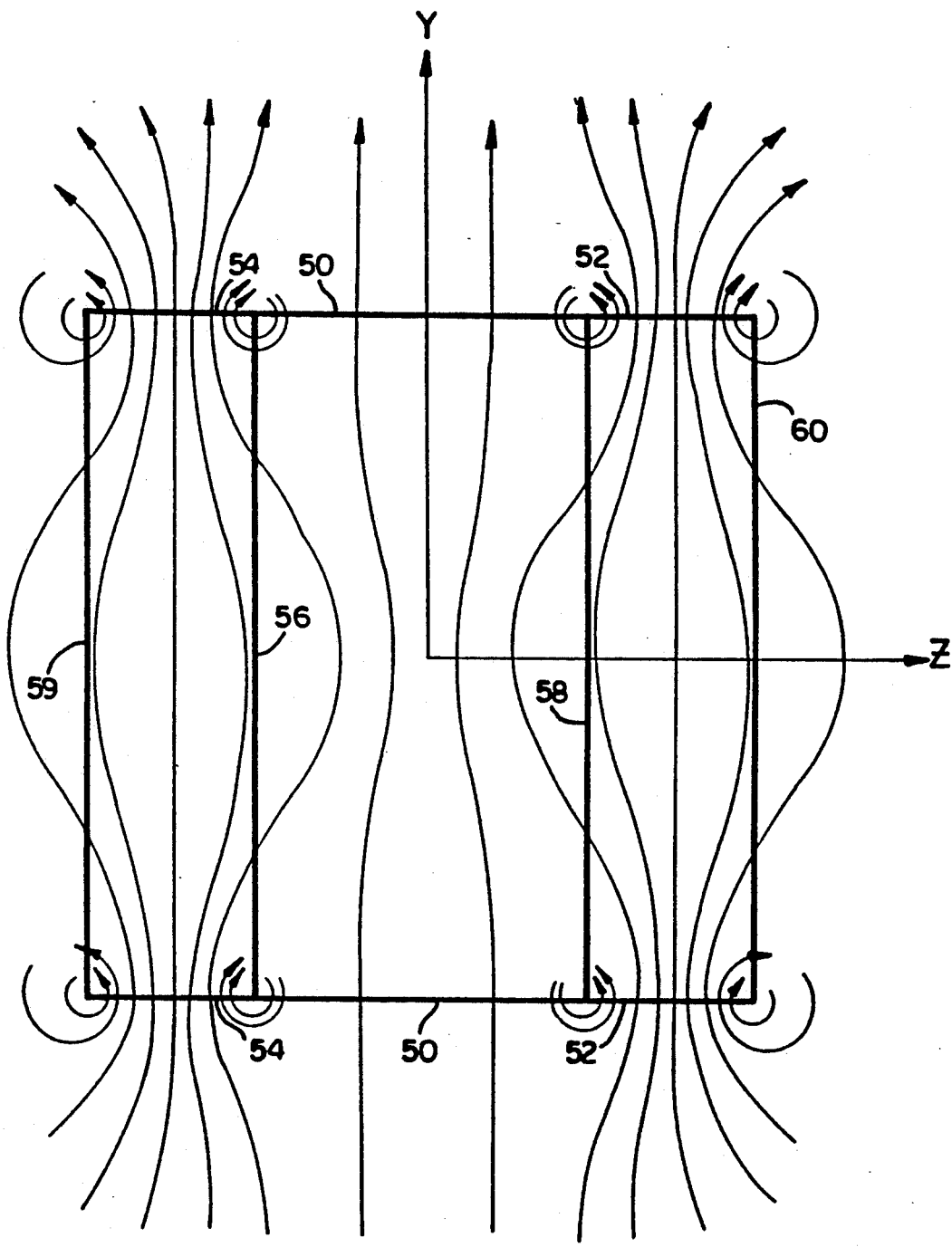

FIG. 9b is a plot of the radio frequency flux lines of the outer resonant structures coupled through the inner structure in a plane through the longitudinal axis of the coil.

Figure 11:
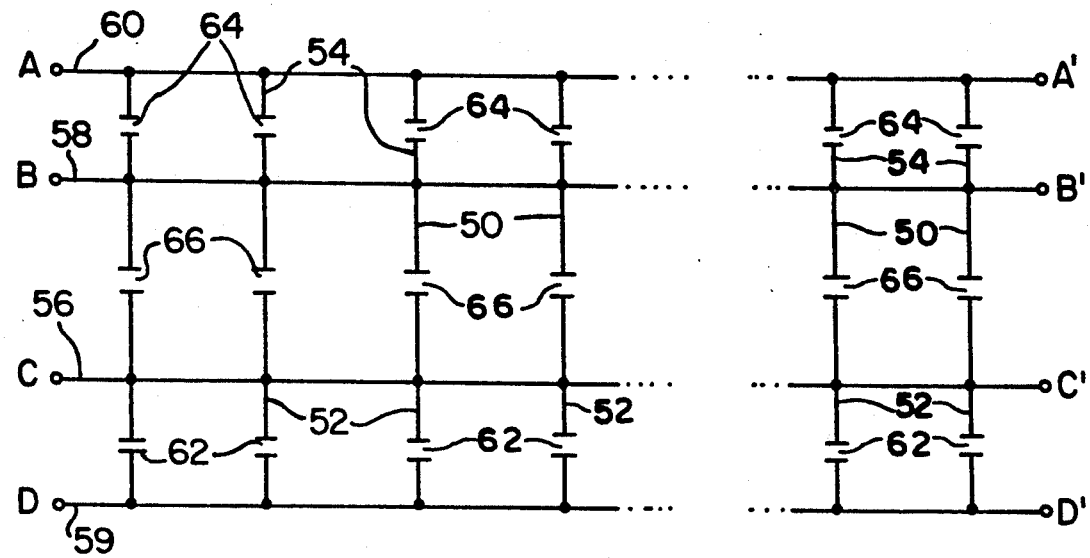
Figure 12:
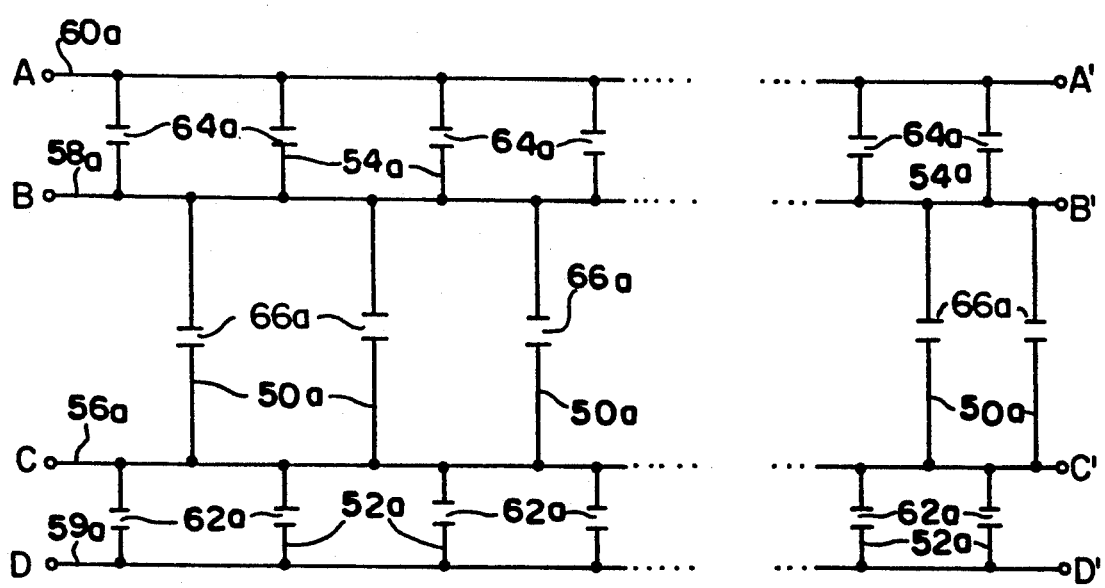
Figure 13:
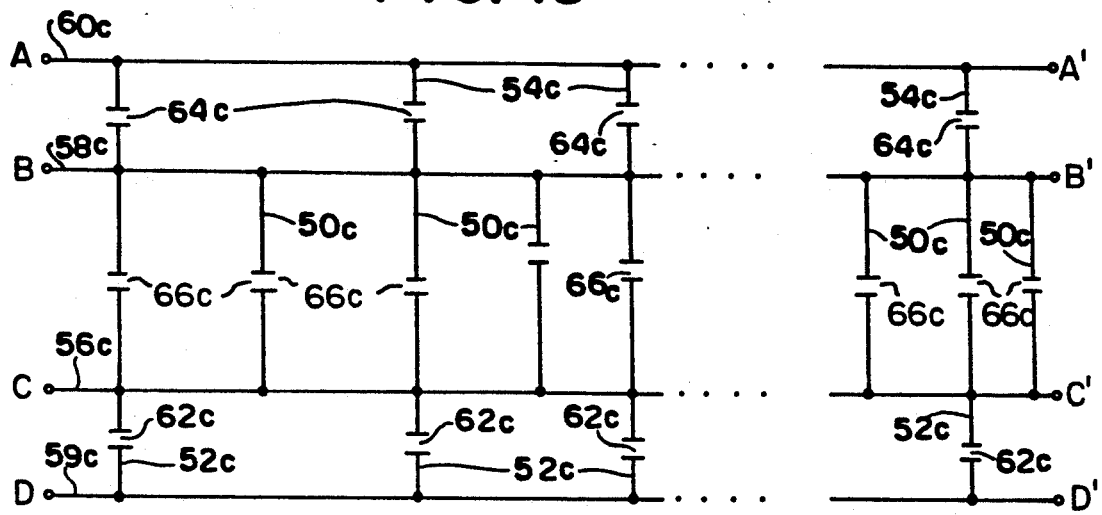
Figure 14:
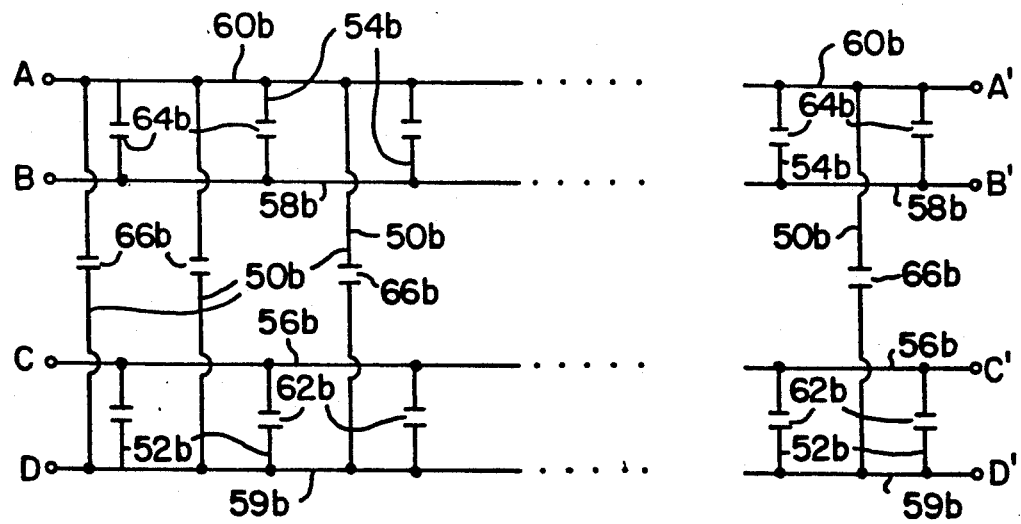

FIG. 10 depicts the preferred physical form of the present invention in a planar developed representation showing mounting supports utilized in the preferred embodiment;

FIG. 11 is a schematic partial development of the preferred embodiment circuit from FIGS. 2b and 10 to provide direct comparison with the following figures; and FIGS. 12, 13 and 14 are schematic partial developments similar to FIG. 11 showing alternative circuit configuration embodiments of the present invention.

PRIOR ART

The applied field $B_o$ by convention is considered to be directed in and defining the z-direction for NMR. RF coils that are a part of a simple resonant circuit, have a single distribution of current oscillating in phase and produce a linearly polarized radio frequency magnetic field, $B_1$, over the sample. The linearly oscillating component B₁ transverse to the applied field $B_o$ (generally considered to be directed in the z-direction), $B_{Lxy}$, mutates the nucleus in a predetermined manner during transmission. Likewise, by the principle of reciprocity, the coil receives signals from nuclei of the sample with a profile weighted by the magnitude of $B_{Lxy}$.

It is desirable and often necessary for many NMR experiments or pulse sequences to operate an NMR probe (either sequentially or simultaneously in time) at two frequencies. It was recognized very early that there are two ways of achieving this. The first was to take advantage of the isolation that one can obtain by using two crossed or spatially orthogonal NMR coils. The second method is to use a single NMR coil and add inductor-capacitor pairs to make it doubly resonant. Another class of multiply tuned resonant circuits, called over-coupled tank circuits, are constructed by strongly coupling circuits which are individually resonant (see M. D. Schnall et al., J. Magn. Reson. 67, 129-134 (1986)). Coupling of the circuits is reactive and can be either capacitive, inductive, or both. When two resonant circuits of approximately the same resonant frequency are coupled strongly to one another, two modes develop in the individual resonant circuits at different frequencies in which the currents are either in-phase or out-of-phase with one another. In both classes of double resonant circuits, currents are circulating in the resonant pairs at both frequencies. Thus, when tuning and matching of one of the resonant pairs to affect one mode, the second mode is invariably affected.

It is well known that further improvement in NMR probe transmission efficiency can be obtained by the use of coil structures which create a circularly polarized $B_1$ field transverse to the applied field $B_o$ (see Chen et al.). Within a linear polarized coil, transmitter power is divided equally between left-hand and right-hand circular polarizations. Since only one of these polarizations matches the precessional motion of the nuclei, a factor of two reduction in the power can be achieved by direct generation of the single polarization. By reciprocity, the signal detected from the sample will likewise double. Noise from the two linear channels used to detect the polarization, on the other hand, is uncorrelated and therefore increases by a factor of root two for equal gain channels (noise amplitudes add in quadrature). A net increase of root two in sensitivity can thus be obtained by use of a circularly polarized coil.

A simple embodiment of a circularly polarized coil is two circular loop coils positioned 90 degrees with respect to one another. If transmitter power is applied to the ports of each single-tuned coil 90 degrees out of phase, a single circular polarization will be generated at the center of the two coils. In the same manner, when free-induction signals from each port of the coils are combined in quadrature, or 90 degrees apart, only a single circular polarization, such as that imparted by precessing nuclei of the sample, is detected. Another embodiment of a circularly polarized coil is the "birdcage" resonator, so called because of its appearance (see C. E. Hayes et al. (1985) and U.S. Pat. Nos. 4,692,705 and 4,694,255). A distributed inductance-capacitance structure of this type characteristically has a number of electrical modes. The fundamental electrical ($k=1$) modes provide two spatially orthogonal and linearly oscillating modes in the interior of the coil (see J. Tropp (1989)). These modes, by virtue of their sinusoidal distribution of current around the coil periphery, provide a more homogeneous $B_1$ field across the sample (see also Hinshaw Patent No. 4,439,733). The resonator may be driven in circularly polarized mode at both frequencies either capacitively across the input/output coupling points, as shown in FIG. 2b, or inductively with coupling loops, like the ones shown in FIGS. 3a and 4a, spaced 90 degrees apart. It is very important that matching circuitry couple only to their respective electrical modes; coupling of a given port to both electrical modes will quickly degrade either transmitter or receiver efficiency, depending upon the relative polarity of the coupling. The electrical isolation measured between the coupling ports is a measure of the degree to which each port couples only to its designated linear ($k=1$) mode. Variable capacitors mounted about the periphery of the coil are used to rotate and align the linear modes. When the linear modes and respective coupling parts properly aligned, a high degree of electrical isolation between the ports is achieved. Under the condition of weak coupling between matched ports, the ratio of the output voltage to the input voltage at the other port is $\kappa Q/2$, where $\kappa$ is magnetic coupling coefficient and Q is the circuit Q. For high Q coils, a high degree of mode isolation is thus required to reduce the voltage ratio to a value much less than one. In practice, we have found that this value should be 0.03 ($-30$ dB) or greater for superior transmitter/receiver performance.

Figure 1A:
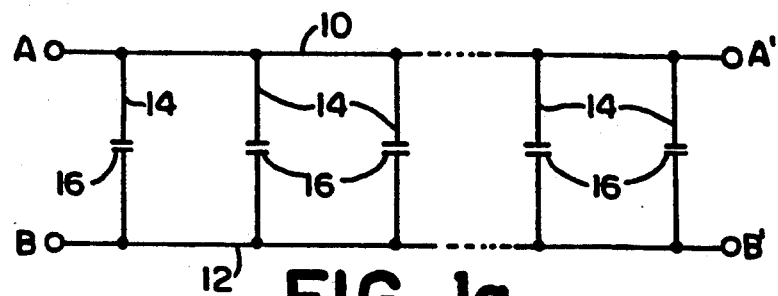
FIG. 1a is a developed partial schematic for a prior art single-tuned low-pass volume resonator.
Figure 1B:
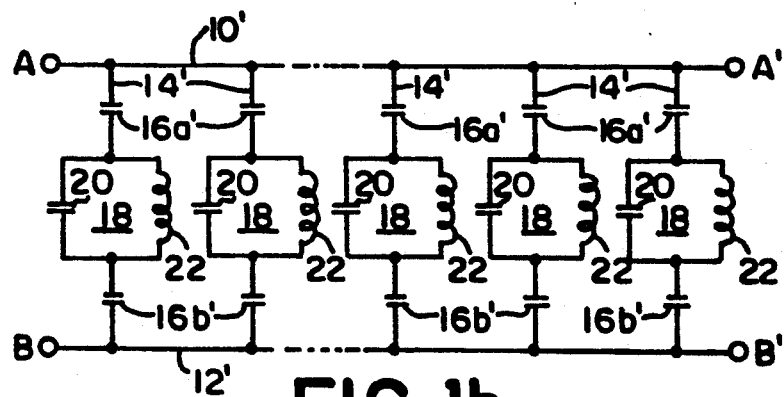
FIG. 1b is a developed partial schematic for a prior art double-tuned band-stop volume resonator.
Figure 1C:
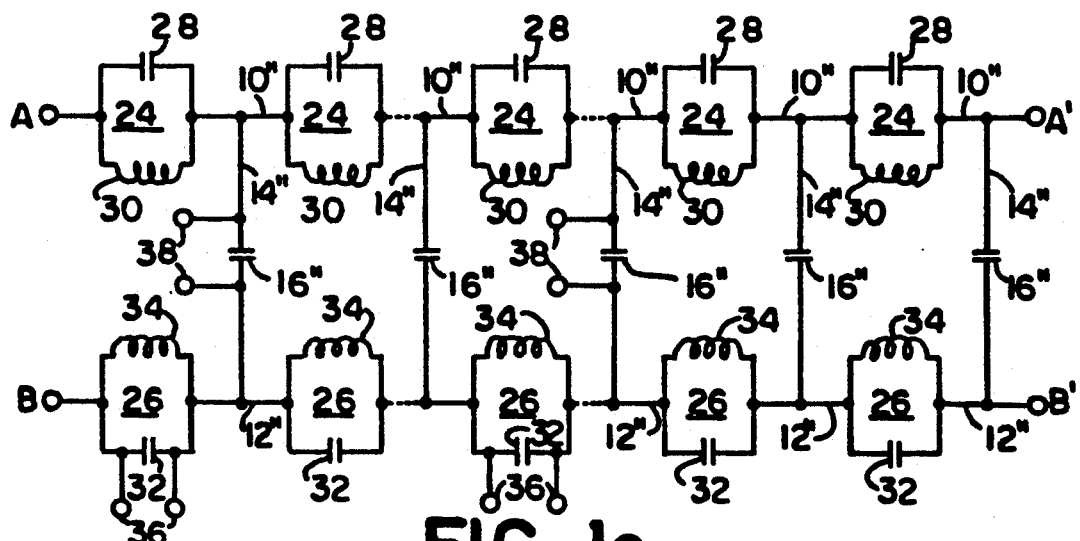
FIG. 1c is a developed partial schematic for a prior art double-tuned low-pass volume resonator.

When contemplating double-tuning of circularly polarized coils, there is a manifold increase in the possible interactions among elements for tuning, matching, and mode alignment of the probe. As an example, we use the low-pass birdcage resonator of FIG. 1a. It effectively involves a pair of closed ring conductors 10 and 12 having uniformly spaced identical connecting conductors 14, each of which contains a bypass capacitor 16. Double-tuning of this circuit with the standard method of inserting inductor-capacitor pairs in ring conductors 10 and 12 results in the "band-stop" birdcage resonator of FIG. 1c. In FIG. 1c each of the connecting paths 14" contains a capacitor 16". In each closed ring conductor 10" and 12" there is connected a resonant circuit, resonant circuit 24 in ring 10" and resonant circuit 26 in ring 12". Each of the resonant loops 24 contains a capacitor 28 and inductance 30 in parallel; each of the resonant loops 26 contains in parallel a capacitor 32 and inductance 34. Similarly, double tuning of the circuit of FIG. 1a by inserting inductor-capacitor pairs 18 in the connecting conductors 14' results in the low-pass resonator of FIG. 1b (see G. Isaac et al., J. Magn. Reson. 89: 41-50 (1990). In each connecting conductor 14 there is a resonant circuit 18 containing a capacitor 20 and inductor 22 in parallel. Capacitive or inductive coupling may be used for any of the circuits of FIGS. 1a, 1b and 1c for input and output at both NMR frequencies as illustrated by capacitive coupling 36 and 38 in FIG. 1c. With twice as many linear modes occurring at each NMR frequency, it is apparent that the doubly-tuned version will exhibit additional between frequency interactions when compared with a double-tuned linear coil. The number of interactions will be further increased by the need to align the linear modes at each frequency. It is apparent that complex tuning-matching interactions exist even in a well aligned resonator. Owing to the high degree of isolation between each mode pair, the most sensitive of all adjustments involves mode alignment at both frequencies. Interactions involving tuning at one frequency, mode alignment and thence matching at the other frequency are cicular in iteration, with iteration not necessarily progressing towards optimal tuning, mode alignment, and matching. In initial studies of a "band-stop" double-tuned birdcage (see A. R. Rath, J. Magn. Reson. 86: 488–495 (1990)) and a "low-pass" double-tuned birdcage (see Isaac et al.), true simultaneous operation of the resonator in quadrature at both frequencies was not achieved. It is therefore imperative that the design of a resonator allow for a reduction or elimination of these interactions if complete tuning, matching, and alignment of the coil is to be performed quickly. This becomes even more important for clinical and in vivo applications where variations in sample size and shape have the greatest effects upon matching and mode alignment.

The $B_1$ field of a birdcage resonator double-tuned with inductor-capacitor pairs is derived primarily by currents flowing in the conductor of the birdcage coil. The gross $B_1$ field distributions at each frequency will be substantially the same. For the short birdcage coil pattern which has a length chosen optimally for spectroscopy of the head, the field variation at the proton frequency is too large for the purposes of imaging and proton decoupling. With one frequency tuned for protons for proton decoupling, the decoupling efficiency will be degraded in regions of the sample where proton $B_1$ field has deviated appreciably from its nominal value, for example, by falling to half its value at the coil center. Inadequate decoupling can occur in important regions of the sample resulting in artifacts in the spectrum of the X-nucleus under observation.

SPECIFIC DESCRIPTION OF THE INVENTION

The present invention involves a dual RF resonator which can be operated simultaneously and in circularly polarized mode at each of two frequencies. In work which has been performed, the prior art coil shown in FIG. 1a is tuned to the phosphorus frequency at 1.5 Tesla (25.67 MHz) and has been used to acquire high quality spectroscopic data from the human head. For this work, the second frequency of the dual resonator is designed to operate at the hydrogen proton frequency of 63.43 MHz. For clinical spectroscopy studies involving phosphorus and other low frequency nuclei, it is especially important that the loss in sensitivity in converting from a single-tuned to a dual tuned birdcage resonator be no greater than a few percent. Otherwise, the benefits from decoupling of proton nuclei with the second frequency of the dual tuned resonator will be compromised. Similarly, loss in sensitivity, transmitting efficiencies, and $B_1$ field homogeneity at the proton frequency will compromise decoupling efficiency and proton image quality. The specific technical aims of the dual tuned resonator are primarily (1) to provide simultaneous transmit/receive capability at two frequencies, (2) to operate in circularly polarized mode at both frequencies, (3) to reduce circuit interactions between frequencies, to allow the spatial quadrature or linear modes to spatially align with their respective coupling sites, (4) to reduce circuit interactions between frequencies, to allow the electrical modes at each frequency to be individually tuned and matched, and (5) to obtain homogeneous $B_1$ fields in the region of the sample at both frequencies.

The preferred embodiment of the dual RF resonator, shown in FIG. 2a and shown schematically in FIG. 2b, may be referred to as a "four ring" birdcage resonator. In this regard the geometry closely resembles that of an RF resonator disclosed in co-pending U.S. patent application Ser. No. 561,898 filed Aug. 2, 1990 and U.S. patent application Ser. No. 603,947 filed Oct. 25, 1990. The four conductive rings 59, 56, 58, 60, which are coaxial, of the same diameter, and spaced along the coil axis to define the cylinder of the "birdcage", are needed to achieve the aims enumerated above. This embodiment is preferred on two counts: first because it is electrically different from the prior art and second because of the specific form that it assumes. Relative to the form, it can be seen in FIG. 2a that a coil is supported on a thin walled tube 40 of a preferably transparent insulating material. It is also preferably capable of being made of sufficiently large size to permit a patient's head to be placed within the tube. The outer cylindrical surface of the tube is covered with a foil or sheet 42 which has through it a plurality of rectangular or oblong openings 44, 46, 48. In this case the openings are aligned along elements of the cylinder and the central opening 44 while of the same width circumferentially is of different length axially from openings 46 at one end and opening 48 at the other. The openings 44, 46 and 48, respectively, are arranged around the circumference equally spaced from one another. The openings are not only equally spaced from one another and uniform in size, but the conductive segments 50, 52 and 54, respectively, between them are uniform. Between openings 44 and 46 is circumferential continuous ring 56 and between openings 44 and 48 continuous ring 58. At the outside edges are continuous rings 59 and 60, respectively. Strip segments 52 and 54 between continuous rings 56 and 59, and between rings 58 and 60 are interrupted by gaps which are bridged by capacitors 62 and 64 respectively. Strip segments 50 between continuous rings 56 and 58 are also interrupted by gaps which are similarly bridged by capacitors 66.

While the preferred embodiment of the RF resonator has been described in terms of a flat sheet formed about a tubular support, it will be understood by those skilled in the art that the conductors may be made up of individual conductive elements which are wires, conducting tubes, flat conducting tapes or any combination thereof.

In the preferred embodiment of FIG. 2b, a low-pass resonant structure for the phosphorus (P-31) frequency is contained within the core of the coil defined by the two displaced inner rings 56, 58, the conductive segment connections 50 between them and capacitors 66. The conductive segments are parallel to the longitudinal axis of the coil and to one another and are evenly spaced around the cylinder they define with the rings. The section of the coil formed by the inner, evenly spaced pair of conductive rings 56,58 and the evenly spaced conductive segments 50 connecting them will hereafter be referred to as the "inner structure". Two outer low-pass birdcage structures share common rings 56,58 with the inner low-pass structure. Extending between inner rings 56,58 and outer rings 59,60 are conductive segments 52,54. The segments 52,54 are parallel to the longitudinal axes of the coil and to one another and are evenly spaced around the cylinder they define with the rings. The capacitors 62,64 are added in conductive segments 52,54 midway between conductive rings 56,58 and 59,60, respectively. Conductive segments 50 of the inner structure and 52,54 of the outer structure are parallel to the longitudinal axis of the resonator and are in line with one another. Input and output coupling to the resonator may be either inductive or capacitive. In FIG. 2b, capacitive coupling to the linear modes of the inner structure may be accomplished using input/output terminals 61 and 67 at the selected NMR frequency. Circularly polarized operation of the inner structure is accomplished by coupling simultaneously to terminals 61 and 67, 90° out of phase with one another. Similarly, capacitive coupling for circularly polarized operation for the two outer structures strongly coupled through the inner structure is accomplished using input/output terminals 63a or 63b or both at the selected frequency and input/output terminals 65a or 65b or both at the same frequency 90° out of phase with one another.

An essential feature, to be described later, is the isolated operation of the inner structure and the outer structure pair. A better understanding of the coil depicted schematically in FIG. 2b can be acquired by study of the lumped-element equivalent circuits of these respective structures shown in FIGS. 3a–3c and 4a–4c and the composite structure formed by joining the structures together seen in FIGS. 5a and 5b. The lumped element inductances are shown as the number of the segment in which they appear with the suffix L, i.e., 52L, 54L, 56L, 58L, or in those cases where a capacitance splits a segment by L and L', i.e., 62L, 62L', 64L, 64L', 66L and 66L'.

The inner structure of the coil is capable of operating independently as a conventional low-pass "birdcage" resonator by only attaching the capacitors 66 to the inner conductive segments, as indicated in FIG. 3a. This is because no current can flow in the outer meshes, since the outer conductive segments are broken. Input/Output inductive coupling may be accomplished as shown using a single inductive loop 67 for a linearly polarized operation, or a pair of such loops in quadrature with the inputs 90° out of phase with one another. The inner structure can then be modeled in the usual way as a balanced-ladder network, a portion of which is shown in FIG. 3b. The complete circuit of the inner structure is formed in FIG. 3b by joining the points labeled B and C to the points labeled B' and C', respectively. The ladder network is made up of the sixteen repeat circuit units of FIG. 3c. Inductors 56L and 58L represent the inductance associated with each ring segment 56,58 along the conductive ring pair of the inner structure. These inductors are all mutually inductively coupled. Likewise, inductors 50L and 50L' associated with the conductive segments of the inner structure are mutually inductively coupled to each other and to the inductors all the other conductive segments. The network of FIG. 3b is referred to as a "low-pass" structure because of the similarity of the repeat circuit units to a conventional low-pass filter. At a given frequency, there will be a net phase shift $\Delta\phi$ of the voltage through the repeat element. The coil will resonate only when the accumulated phase shift between terminals B-C and B'-C' is an integral multiple of $2\pi$ radians. That is, for a coil with N conductive segments or segments, N $\Delta\phi = k\pi 2$. k is referred to the mode number, and for a coil with N conductive segments, where N is an even number, $N/2 \geq k \geq 1$. Modes $k=1$ to $k=(N/2)-1$ have two orthogonal modes associated with each other. Each of these modes are capable of being independently tuned and excited. (See U.S. Pat. No. 4,692,705).

Referring to FIG. 3d, eight modes 80, 81, 82, 83, 84, 85, 86, 87 were measured for a sixteen leg inner low-pass structure using an eight centimeter diameter inductive loop 67 placed over and centered upon one of the capacitors 66. The y-axis is the reflected power from the loop as measured using an impedance bridge and a Hewlett-Packard 4195A network analyzer. The value of the capacitors 66 were about 66 picofarads. Of these modes, only the $k=1$ modes, produce a homogeneous RF $B_1$ field in the region of the coil center. The $k=1$ mode 80 is a quadrature mode, that is, it is in general comprised of two orthogonal or independently operating "X" and "Y" linear modes producing respectively about the coil axis sinusoidal and cosinusoidal current distributions in the conductive elements of the coil. The latter produce respectively two linearly oscillating and perpendicular $B_1$ fields in the interior of the coil. Higher order modes occurring at respectively higher frequencies produce increasingly less homogeneous RF fields, all of which have nulls in amplitude at the coil center of FIG. 3a for an ideal resonator with N-fold symmetry about the coil axis, that is, a coil having equal size capacitors, equal size and equally spaced conductive segments, and equal size conductive end ring segments. The $k=1$ linear modes 80 will be indistinguishable, resonating at the same frequency and having no preferred orientation. In the usual occurrence of a nonsymmetric coil where the capacitors may be slightly unequal in value and the conductor slightly non-uniform, the modes will be linear and spatially orthogonal to one another, will have preferred orientations, and will resonate at slightly different frequencies. See J. Tropp, J. Magn. Reson. 82:51–62 (1989). The coupling 67 shown in FIG. 3a is inductive, with a single inductive coupler suitable for coupling to a single linearly polarized mode. Coupling to both linear polarized modes of the inner structure for circularly polarized operation requires two such couplers spaced approximately 90° apart about the coil axis.

Referring to FIG. 4a, each outer structure is capable of operating independently as a low-pass birdcage resonator, where capacitors 64 are mounted on the conductive segments. A single inductive loop 67 positioned as shown will provide linearly polarized operation. In the absence of capacitors 66 and 62, no current will flow in either the inner structure or in the opposite outer structure. The exception occurs with the conductive ring 56 between the inner structure and the opposite outer structure. Being far away, however, the effect of this conductive ring upon the resonant modes of the independently operating resonator is very small. This has been confirmed by activating the opposite low-pass resonator with identical value capacitors and observing virtually no frequency shifts of the resonant modes. FIG. 4b is the lumped-element equivalent circuit of one outer low-pass birdcage resonator shown in FIG. 4a. The ladder network is made up of the repeat circuit units shown in FIG. 4c. The complete circuit of the outer structure is formed by joining terminals A and B to terminals A' and B', respectively. Inductors 60L represent the inductance associated with each end conductive ring segment 60 and inductor 58L that of the adjacent inner conductive ring segment 58 shared with the inner structure. These inductors are all mutually inductively coupled. Likewise, inductors 54L and 54L' associated with the conductive segments 54 of the outer structure are all mutually inductively coupled. As for the inner structure, the network of FIG. 4b is referred to as a low-pass structure because of the similarity of the repeat circuit unit with a conventional low-pass filter network. An outer structure of N conductive segments, where N is an even number, will likewise exhibit N/2 independent modes with mode numbers k, $N/2 \geq k \geq 1$.

Referring to FIG. 4d, eight modes 90, 91, 92, 93, 94, 95, 96, 97 were measured for this sixteen segment low-pass structure using an eight centimeter diameter inductive loop 67 placed over and centered upon one of the capacitors 64. The Y-axis is the reflected power from the loop as measured using an impedance bridge and a Hewlett-Packard 4195A network analyzer. The values of the capacitors 64 were about 19 picofarads. Of these modes, only the $k=1$ linear modes 90 produce homogeneous RF fields in the interior of the outer structure. Higher order modes ($k>1$) produce inhomogeneous RF fields in the interior of the coil, all of which have nulls in amplitude along the coil axis. Like $k=1$ mode 80 of FIG. 3d, mode 90 is a quadrature mode generally comprised of two orthogonal "X" and "Y" linear modes which produce sinusoidally and cosinusoidally distributed current distributions about the coil axis. For a resonator with N-fold symmetry about the coil axis, that is, a coil having equal size capacitors, equal size and equally spaced conductive segments, equal conductive end ring segments, and equal size conductive inner ring segments, the $k=1$ modes will resonate at the same frequency and will have no preferred orientation. In the usual occurrence of slightly non-symmetric coil, the modes will be linear and spatially orthogonal to one another, will have preferred orientations, and will resonate at slightly different frequencies. The coupling 67 shown in FIG. 4a is inductive, with a single inductive coupler suitable for coupling to a single linearly polarized mode. Coupling to both linearly polarized modes of the outer structure for circularly polarized requires two such couplers spaced approximately 90° apart about the coil axis.

The network of FIG. 5a is the lumped-element equivalent circuit of the resonator invention shown in schematic form in FIG. 2b. The complete circuit of the resonator is formed by joining terminals A, B, C, and D to terminals A', B', C' and D', respectively. The composite balanced ladder network of FIG. 5a is comprised of the repeat circuit units shown in FIG. 5b. With all capacitors attached and all current paths completed, the inner and outer structures of the dual tuned resonator couple via additional mutual inductances and additional circuit connections. Because the inner structure shares common inner ring segments 56 and 58 with the respective outer structures, the mutual inductive couplings between the inner structure and each outer structure are strong. However, because the current paths in the outer conductive segments 52 and 54 are interrupted by the high impedance of capacitors 62 and 64 at the lower frequency, the currents at the lower phosphorus frequency are confined primarily to the inner structure. Owing to their increased separation, the end conductive inductors 59L, 60L are very weakly mutually inductively coupled to the inner ring inductors 58L, 56L. Owing also to their separation, inductors 52L and 52L' and 54L and 54L' are only weakly mutually inductively coupled to outer ring inductors 592 and 60L. The two outer structures are therefore only weakly mutually inductively coupled. This has been confirmed, as described above, by activating in sequential fashion the two outer structures, installing first capacitors 64 and then 62. No noticeable alteration in the mode structure of FIG. 4d of the first outer structure was observed upon activating the second. Coupling of the two outer structures therefore occurs primarily through the conductive inner segments 50. At the higher proton frequency, inner segment capacitors 66, which are used primarily to tune the low frequency of the inner structure, have low impedance with respect to the inner segment inductors 50L and 50L'. This has been confirmed for the present embodiment by shorting the capacitors 66 and observing only a slight upward shift in proton frequency. Coupling of the $k=1$ modes of the outer structures is therefore primarily through inner segment inductors 50L and 50L'.

No formal analytic theory exists for a composite volume resonator of this type. However, the resonant inner structure and the resonant outer structure pair, which is strongly coupled through the inner structure, operate substantially independently and can be treated as independent resonators for the fundamental $k=1$ modes, as will be described below. The modes of FIG. 3d were observed with 66 picofarad capacitors used as the capacitor 66 of the inner structure without capacitors in the outer structures. Upon installing in both outer structures 19 picofarads capacitors 62 and 64 to activate the dual tuned resonator, 24 discrete resonances of FIG. 5c and FIG. 5d combined were observed. These resonances were observed with reflected power using the same inductive coupling loop 67 of FIG. 3a placed over the resonator, such that the loop partially covered both the inner structure and one of the outer structures. Of these modes, eight modes 80,81,82,83,84,85,86,87 were low-pass modes, which was confirmed by placing the loop only over the inner structure. Of the remaining 16 modes the eight modes 90, 91, 92, 93, 94, 95, 96, 97 are referred to as the "counter-rotating" modes and the other eight modes 100, 101, 102, 103, 104, 105, 106, 107 are referred to as the "co-rotating" modes, as will be explained below. Comparing the positions of the low-pass modes of FIG. 3d with those of FIG. 5c, the effect of activating the outer structures is to shift the $k=1$ mode 80, $k=2$ mode 81 and $k=3$ mode 82 to slightly lower frequency (0.45 MHz or the $K=1$ mode 80); $k=4$ to $k=8$ modes 83,84,85,86,87 are unaffected. Comparing the positive of the low-pass modes of FIG. 4d with those of FIG. 5c and FIG. 5d, the effect of activating the outer structures is to shift the counter-rotating $k=1$ mode 90 and counter-rotating $k=2$ mode 91 to slightly lower frequency (0.5 MHz); counter rotating $k=3$ to $k=8$ modes 92,93,94,95,96,97 remain essentially unaffected. The $k=1$ co-rotating low-pass mode 90 appears just below the $k=3$ low-pass mode 82 and the co-rotating $k=1$ low-pass mode 100 appears just below the $k=4$ Low-pass mode 83. The substantially independent manner in which the inner structure resonates in the presence of the two outer structures is reflected in the fact that no additional modes were observed with a coupling loop placed over the inner structure. Furthermore, the $k=1$ mode 80 of the low-pass structure was also observed to have only a small downward shift in frequency (0.45 MHz) after adding the 19 picofarad capacitors to the outer structures. FIG. 5e is a graph of reflected power response versus frequency for the fully activated resonator with an inductive loop placed at the physical center of the inventive dual tuned resonator. Only two modes are observed; $k=1$ mode 80 for the inner low-pass structure and the "co-rotating" $k=1$ low-pass mode 100 of the coupled outer structures. These are the only two modes which produce sinusoidally distributed currents in phase about the coil periphery and the only ones therefore to produce highly homogeneous $B_1$ fields in the center of the coil.

With a single outer structure activated using one set of capacitors 62 or 64 in the form shown in FIG. 4a, the k=1 mode pair will have its own preferred orientation, as shown in FIG. 6a. This orientation reflects small variations in the capacitive elements and conductors which disturb the symmetry of the coil about the coil axis. With capacitors of the first outer structure removed, the second outer structure will also have a preferred orientation for its k=1 modes as shown in FIG. 6b with a second set of capacitors mounted at designated locations. With capacitors mounted on both the outer structures in the same pattern and upon reconnecting the capacitors 66 of the inner structure, the k=1 mode pairs of each outer structure over-couple and lock in orientation, as shown in FIGS. 7a and 7b. Upon locking in orientation, two new mode pairs are formed and each span the length of the coil. Over-coupling through the inner structure also causes a frequency splitting of the modes of FIGS. 7a and 7b in much the same manner as simple resonant circuits (See M. D. Schnall et al. below). This frequency splitting for new k=1 mode pairs have the same radial orientation and sinusoidal current distributions as illustrated in FIGS. 8a and 8b, respectively.

The modes of FIGS. 7a and 7b are referred to as the counter-rotating k=1 modes, since the currents in each outer structure have opposite senses. According to the right-hand rule, they produce RF fields in the coil having opposite directions. The RF fields of these modes produce a linear gradient in RF intensity along the longitudinal axis and therefore a null in RF field intensity at the center of the coil. This RF field gradient may be useful in rotating frame experiments by providing spatial selectivity in the Z-direction. As indicated in FIG. 8a, the sense of the currents in each outer structure is also such as to produce no net voltages across the inner ring segments 56 and 58. Thus with no currents flowing within the coupling inductances of the inner structure, the counter-rotating k=1 modes 90 of FIG. 5c have resonant frequencies very close to the k=1 modes 90 of an isolated resonant outer structure as shown in FIG. 4d with no inner structure capacitors 66.

The modes of FIGS. 7b and 8b are referred to as the co-rotating k=1 low-pass mode 100, since the currents in each outer structure have the same sense and, according to the right-hand rule, produce RF fields in the coil having the same direction. As indicated in FIG. 8b, the sense of the currents in each outer structure is such as to produce cooperative voltages across the inner ring segments 56 and 58 causing currents to flow through the inner segments 50 of the inner structure. The intensity of the mesh currents within the inner structure segments 50 will be smaller than those of the outer structure, since the inner structure serves primarily to couple the outer structures, but they will have the same sinusoidal distribution in intensity as the currents in the outer segments 52 and 54. The effect of currents flowing through the inner structure is to improve the RF field homogeneity along and in the region of the longitudinal axis. Since the effect of the inner structure is to provide inductive coupling of the outer structures (as opposed to capacitive coupling) the frequency of this co-rotating k=1 mode 100 is shifted upward (as opposed to downward) from the counter-rotating k=1 mode 90. See M. D. Schnall et al., J. Magn. Reson, 67, 129-134 (1986). For this embodiment, we have found that the capacitors should be approximately 66 picofarads for the inner structure and approximately 19 picofarads for the outer structure to resonate the dual tuned resonator at 26 MHz for phosphorus nuclei and 63 MHz for hydrogen (1H) nuclei; the respective resonant frequencies for a static field $B_O$ of 1.5 Tesla.

A homogeneous $B_1$ field will produce a more uniform distribution of nutation angles during transmission and, by reciprocity, a more uniform receiver response. It is well known that the $B_1$ field of a birdcage resonator can be made more homogeneous in the x-y plane and planes transverse to its longitudinal axis by increasing the number of conductive segments or struts between the end conductive rings. See U.S. Pat. Nos. 4,692,705 and 4,694,255. For the preferred embodiment a sixteen segment coil was chosen to provide adequate RF field homogeneity over the region occupied by the human head. Referring to FIG. 9a, RF field homogeneity in planes through the longitudinal axis of a birdcage resonator increases with the length of the coil. A long coil, however, will acquire increased resistive losses both from the additional length of conductive segments and from increased eddy currents in the sample. The sensitivity of the coil will thereby suffer from reduced circuit Q. The "optimal" geometry employed in the inner structure represents a compromise in $B_1$ field homogeneity to improve the sensitivity of the coil at the lower frequency, in this case for the phosphorus frequency. The $B_1$ field flux for the k=1 mode of the inner structure is shown in FIG. 9a for the y-z plane. In FIG. 9a it can be seen that while large variations in field intensity occur near the conductive inner rings and segments, the variation is much less in the volume occupied by the sample at the center of the resonator.

Owing to their axial separation, the coupled outer structures provide even greater $B_1$ homogeneity at the mode which is useful for NMR. FIG. 9b shows the $B_1$ field flux for the y-z plane of the coil for the co-rotating k=1 mode 100 of the coupled outer structures shown in FIG. 8b. Currents of this mode are superpositions of sinusoidally distributed currents in the outer and inner structures. The straight segment currents in each outer structure for an N segment four ring resonator are given by $$I_n^{so} = I_o \sin\left(\frac{2\pi}{N}\right)\sin\left(\frac{2\pi n}{N}\right)$$

where n=0, 1, 2, ..., N-1 is the conductive segment number; an inductive drive is centered upon the n=0 conductive segment and $I_o$ is a constant. See J. Tropp, above. Similarly, the currents in the end conductive rings 59 and 60 are of opposite sense and have magnitudes $$I_n^{ro} = I_o \cos\left(\frac{\pi}{N}\right)\cos\left(\frac{\pi(2n-1)}{N}\right)$$

Because the inner conductive segments serve to couple strongly the two outer structure, a fraction p of the currents flowing in the outer conductive segments 52, 54 flows in each of the respective inner conductive segments 50. The inner segment currents of co-rotating mode 100 are in-phase with those of the outer segments and are therefore give by $$I_n^{ri} = p I_o \sin\left(\frac{2\pi}{N}\right)\sin\left(\frac{2\pi n}{N}\right)$$

Since the inner conductive rings 56,58 are shared by the inner and outer structures, currents flowing in them are given by $$I_n^{ri} = (1-p) I_o \cos\left(\frac{\pi}{N}\right)\cos\left(\frac{\pi(2n-1)}{N}\right)$$

with senses opposite those of their respective adjacent outer rings. Because considerably smaller currents flow across the inner segments 50 relative to the currents in the outer segments 52,54, large variations in RF field intensity occur near the coil ring conductors. It can be seen, however, that the outer structures operate in concert with one another near the center of the resonator, producing a much more homogeneous $B_1$ field in the region occupied by the sample. High quality spin-echo proton images of a human head were obtained with a prototype of the inventive resonator. Homogeneity of the images over the human brain were equal to those of a standard linear saddle coil of commercial manufacture. Sensitivity of the dual tuned resonator was 40% greater than the saddle coil and the transmitter power required was 50% less, the expected difference between circularly polarized and linearly polarized coils. Little appreciable loss in coil efficiency was therefore lost in the dual tuned design.

FIG. 10 is a partial developed planar view of a portion of the coil pattern shown in FIG. 2a. The manner in which the physical form of FIG. 2a of the preferred resonator which in complete development has 16 segments, sized and implemented for NMR studies of the head will now be described. The construction of the resonator coil of the invention consisted of the following mechanical steps. Mechanically, the coil is designed to be mounted to a 10.5" o.d. lucite cylinder which is large enough to accommodate most head and nose sizes. The overall distance between the centers of the outer two conductive rings is 25 cm and that of inner two conductive rings is 12.5 cm. Flat metal sheets of 0.0021 inch thick electrically pure copper were used for construction of the conductive coil. The copper sheets were mounted on to a high precision milling machine, where the openings in the meshes for the inner and the two outer structures were cut. High precision milling was used to greatly reduce the tolerances between the adjacent meshes in the inner and outer structures respectively. As shown in FIG. 10, the meshes were cut in such a way that the conductive segments 50 and 52,54 and ring segments 56,58 and 59,60 of both the inner and outer structures were about 0.5" wide. The gaps in the outer conductive segments 55 and the middle segments 57 in FIG. 10 represent the slots where capacitors of appropriate values are mounted for tuning the respective structures. Two separate copper metal sheets, each forming one half of the inner structure and one of the outer structures, were then mounted onto 10.5" outer diameter, 0.25" wall thickness lucite cylinder using lexan supports 70, 72 and nylon screws 74 tapped into the lucite cylinder 40 (FIG. 2a). As can be seen in FIG. 10, the square supports 70 hold the inner conductive rings, inner conductive segments and part of the outer segments in place and were reinforced by three nylon screws 74. Similarly, the remaining part of outer inner structure segments were held by rectangular supports 72, reinforced by two nylon screws 74. The length of the nylon screws were adjusted in such a way that they no longer are a part of the inside cylindrical volume of the resonator.

The terminals A, B, C, and D were electrically connected to terminals A', B', C' and D' in order to make the four conductive rings continuous. To resonate in a static $B_o$ field of 1.5 Tesla, the dual tuned resonator was tuned and aligned to 25.7 Mhz for the phosphorous-31 nucleus and to 63.42 Mhz for the proton nucleus. Procedures for tuning the individual NMR frequencies are the same as those used for tuning a single tuned birdcage resonator. Initially appropriate value and closely identical capacitors were placed in the inner structure slots to tune the inner structure close to phosphorous frequency. Similarly, appropriate and identical value capacitors were placed in the two outer structure slots to tune the coupled outer structures to the proton frequency. Low value trimmer capacitors for tuning each of the four linear modes were added across the fixed capacitors 66 and 62,64 of the inner and outer structures at points corresponding to the alignment of the respective low-pass and high-pass linear modes. Two additional low-value trimmer capacitors were added at 45 degrees on each side of the tuning capacitors for adjustment of isolation, or mode alignment.

Conventional inductive loop as well as capacitive coupling methods may be used to couple power to and receive signals from the resonator of FIG. 2b. The inductive loop mounting structures were incorporated on the outside of the resonator and were designed in the usual manner taking into account the matching and mode isolation for the individual human head. Couplers mounted over the inner structure couple to $k=1$ "X" and "Y" modes of the inner structure and couplers mounted over one outer structure couple to either the $k=1$ co-rotating modes (X and Y) or the $k=1$ counter-rotating modes of the electrically coupled outer structures. A pair of couplers could also be placed in opposite outer structures to excite modes of the outer structure, providing they were spaced 90° apart about the coil axis. A remote tuning and mode alignment scheme using capacitive coupling to the capacitors 66 has been developed for a phosphorus birdcage resonator of the same size and frequency of the inner structure. See J. Murphy-Boesch et al., Abstract: Society of Magnetic Resonance in Medicine, Eighth Annual Meeting, Vol. 2, p. 944, Society of Magnetic Resonance, Berkeley, Calif., 1989. A similar scheme operating at the proton frequency could be used in tandom with this scheme for differential capacitive coupling to the coil at both frequencies.

Referring now to FIGS. 11, 12, 13 and 14 it will be observed that these figures illustrate alternative ways in which the inventive dual frequency resonator illustrated and discussed above may be implemented. FIG. 11 represents the four ring conductor structure having rings 56 and 58 as inner rings and 59 and 60 as outer rings. As in all the illustrations it will be appreciated that the rings are shown only partially and that they are closed into actual rings by connecting together terminals A and A', B and B', C and C' and D and D'. Each of the resonator configurations shown in FIGS. 11, 12, 13 and 14 have common ring configurations and each have the same ring designator except that the designators of FIG. 12 have an "a" suffix, those of FIG. 13, a "c" suffix and those of FIG. 14, a "b" suffix. Interconnecting the rings in FIG. 11 are segments generally parallel to the axis of the resonator. Segments 52 interconnect rings 56 and 59. Segments 54 interconnect rings 60 and 58 and segments 50 interconnect rings 56 and 58. As with the rings the interconnecting segments between the rings connecting the corresponding rings together are given the same number designators but with an "a" suffix in FIG. 12, a "c" suffix in FIG. 13 and a "b" suffix in FIG. 14. FIG. 11 also employs a capacitor 66 in element 50 interrupting that element. Similarly each conductive segment 52 is interrupted by capacitor 62 and each segmemt 54 is interrupted by a capacitor 64. Segments 50b of FIG. 14 differ from the segments of FIGS. 11-13 in that they are connected to end rings 59 and 60 and overlap though they remain insulated from inner rings 58 and 60. In the planar view, the coil of FIG. 14 may be formed by folding inward by 180° the outer structures of the coil of FIG. 12. In the preferred dual frequency embodiments of FIGS. 12-14, each capacitor 64 in element 54 is of the same value, and each capacitor 62 in each element 52 is of the same value. Further, to maintain RF field homogeneity of the co-rotating mode of FIG. 8b, capacitors 62, 62a, 62b, 62c and 64, 64a, 64b, 64c should have the same value, thereby maintaining mirror image symmetry about the mid-plane through the center of the coil perpendicular to the coil axis.

FIGS. 11-14 are provided to show the versatility of the system considering coils of the same overall dimensions. FIG. 12 shows that unlike FIG. 11 the segments 50a do not have to be lined up with the segments 52a and 54a in order for the structure to function. The circulating currents within an individual loop will remain essentially the same in FIGS. 11 and 12. For same size coils and identical value capacitors 66 and 66a and identical value capacitors 62, 62a, 64 and 64a, both the structures of FIGS. 11 and 12 will resonate with the same mode frequencies. Because the resonator of FIG. 13 has half the number of conductive segments 52b and 54b as the embodiment of FIG. 11, its outer structure will exhibit half the number of resonant modes. The value of the capacitors 62b and 64b to produce the same co-rotating k=1 mode frequency will be different from those of capacitors 62 and 64 of FIG. 11. The currents in the outer loops, however, will remain sinusoidally distributed for the co-rotating k=1 mode, producing a substantially homogeneous $B_1$ field in the interior of the coil.

The three figures show among other things that repositioning of segments as in FIG. 12 does not destroy operability. The number of interconnecting segments can even be different in the inner resonator and the outer resonators. An example of this is the resonator shown in FIG. 13. The resonators described in the preferred embodiment included sixteen connecting segments for each resonator band. The outer resonators in FIG. 13 include only eight. Although there are advantages in using the sixteen over eight, the structure of FIG. 13 works very well and has been built and demonstrated. At least four generally parallel high frequency current paths connected to each of the adjacent ring paths are required for the structure to operate in circularly polarized mode. $B_1$ homogeneity may be improved by increasing the number of paths.

The resonator of FIG. 14 illustrates that ring and segment conductors may overlap, using insulative and low capacitance materials. The inner structure now becomes a "spanning" structure which spans the axial length of the resonator. The RF magnetic flux pattern produced by the spanning structure differs from that shown in FIG. 9a, in that it spans the axial length of the resonator passing between the end rings 59 and 60 rather than being confined between the inner rings 56 and 58. The resonator of FIG. 14 is similar to that of FIG. 12, in that inner conductive segments 50b and outer conductive segments 52b and 54b are staggered in their positions about the coil axis. It differs in that the inner segments 50b connect to the end rings 59b and 60b rather than the inner rings 56b and 58b. Both resonators have been constructed found to exhibit comparable mode structures using identical value capacitors 62, 64 and 66. The coil of FIG. 14 was found to exhibit greater coupling and a greater frequency difference between its co-rotating and counter-rotating k=1 modes of the outer structures.

Alternatively, capacitors may be shifted into the conductive rings making the outer bands single ended high pass, or may be shifted into the end conductive rings and segments making the outer bands single-ended band pass. A combination of the above alternatives is also possible. If the resonator is to be a dual frequency co-rotating structure capacitors 62 and 64 will have the same value. Alternatively, capacitors 62 and 64 may be made unequal and the fundamental k=1 modes of each structure maintained equal by suitably modifying the coil dimensions and thereby the inherent inductances and mutual inductances of each. A triple frequency resonator may be designed using different capacitor values for capacitors 62 and 64, resulting in a less homogeneous distribution. Each band can be driven linearly or in circular polarized mode.

It is also possible to have multi-frequency resonators having more than four rings and hence capability of more than three frequencies.

It is well known that increasing the capacitance on radially opposite sides of a single-tuned birdcage resonator and decreasing the capacitance on the sides in quadrature with the first, such as by superposing a cos $2\phi$ variation in capacitance upon an average capacitance value, will result in two quadrature linear modes tuned to widely separated frequencies. See U.S. Pat. No. 4,694,255 and P. Joseph and D. Lu IEEE Trans. Med. Imaging 8,286-294 (1989). Given its electrical isolation from the outer structure pair, the inner structure could be doubly tuned in this manner to two frequencies, for example to the frequencies of carbon-13 (C-13) and phosphorus-31, to form a triply-tuned resonator. The outer structure pair could remain tuned to the proton frequency, for example, for proton decoupling of both low-frequency nuclei. Similarly, it is contemplated that each of linear modes of the outer structure pair could be tuned to separate frequencies, forming maximally a quadruple resonant coil. A cylindrical resonator of this type is advantageous in that the RF fields at all four frequencies are substantially homogeneous across a cylindrical sample located concentrically in the coil interior. Other modes of operation are contemplated in which the field is less homogeneous within the coil interior. Given the high degree of isolation between the inner structure and any one outer structure, it would be possible to tune each of the three structures to three separate frequencies, when operating the resonator in circularly polarized mode at each frequency or to a maximum of six different frequencies when all structures are operated in linear polarized mode. Operation of the resonator in these various electrical modes in conjunction with various modifications to the form of the coil described above, such as use of the two-fold symmetry of an elipse about the coil axis, will be apparent to those skilled in the art.

Referring to FIGS. 2a and 2b, it will be recognized that the inner conductive rings 56,58 need not be of the same size and shape as the outer conductive rings 59,60. Furthermore, conductive rings 56,58,59,60 need not be precisely circular but may be elipsoidal or segmented or of some other geometric form capable of accommodating the sample. By this, it will also be recognized that conductive segments 50 and 52,54 need not be straight or parallel to each other and the longitudinal axis nor need they be equally spaced. It is only necessary that the geometry not render impossible or impractical the desired orientation and tuning of the linear modes of the resonator.

We claim:

1. An RF resonator for use in NMR comprising:
   at least four coaxial high frequency ring current paths distributed along the axis thereby defined;
   at least four high frequency current paths interconnecting each pair of at least three pairs of ring current paths, adjacent interconnecting paths forming current loops with connecting segments of ring current paths which they interconnect; and
   at least one discrete capacitor interposed in each interconnecting current path whereby in combination with the inductance in each loop, including inherent inductance in the conductors, each loop is resonant, but such that all of the ring current paths are uninterrupted by a capacitor.

2. The RF resonator of claim 1 in which the resonator has axial symmetry in that the structure in each of the four quadrants around the axis is the same as every other quadrant.

3. The RF resonator of claim 1 in which the resonator has symmetry on both sides of a medial plane normal to the axis of the ring current paths.

4. The RF resonator of claim 2 in which the resonator has symmetry on both sides of a medial plane normal to the axis of the ring current paths.

5. The RF resonator of claim 2 in which the current paths interconnecting each pair of ring current paths are equally spaced from one another.

6. The RF resonator of claim 5 in which the capacitors in the current paths in all loops between any two ring current paths have essentially the same value.

7. The RF resonator of claim 6 in which four ring current paths are employed and capacitors of no more than three values are employed.

8. The RF resonator of claim 7 in which only two values of capacitors are employed, those capacitors of the loops between each of the two outer ring current paths and adjacent ring current paths being the same and the resonator having symmetry on both sides of a medial plane normal to the axis of the ring current paths.

9. The RF resonator of claim 8 in which the inner structure formed by the inner ring current paths and connecting current paths therebetween is tuned to one NMR frequency using capacitors of one value, and two outer structures each formed by an outer ring current path and the adjacent inner ring current path are electrically coupled through the current paths between the inner ring current paths and tuned to a second NMR frequency using capacitors of a second value.

10. The RF resonator of claim 8 in which the spanning inner structure formed by the inner ring current paths and connecting current paths therebetween is tuned to one NMR frequency using capacitors of one value, and the two outer structures each formed by an outer ring current path and the adjacent inner ring current paths are electrically coupled through the current paths between the inner ring current paths and tuned to a second NMR frequency using capacitors of a second value.

11. The RF resonator of claim 9 in which input/output couplings to the inner structure between and including two inner ring current paths and spaced essentially 90° apart about the resonator axis can be used to drive the resonator at one NMR frequency in either linearly polarized mode or circularly polarized mode, and input/output couplings to one outer structure between and including an inner ring current path and its adjacent outer ring current path and spaced essentially 90° apart about the resonator axis can be used to drive the resonator at a second NMR frequency in either linearly polarized mode or circularly polarized mode or in a combination of the above.

12. The RF resonator of claim 9 in which the coupling arrangement and the signals supplied to loops of the two outer structures coupled through the inner current paths produce a counter-rotating current distribution.

13. The RF resonator of claim 12 in which the signals supplied and the coupling arrangement produce counter-rotating current distributions which produce no appreciable RF $B_1$ field axially at the center of the resonator.

14. The RF resonator of claim 3 in which four ring current paths are employed.

15. The RF resonator of claim 9 in which the outer structures are configured to have a concentrated sinusoidal distribution of currents, a fraction of which flows through the inner structure to produce a highly homogeneous RF $B_1$ field along and in the region of the coil axis.

16. The RF resonator of claim 10 in which input/output couplings to the inner structure between and including two inner ring current paths and spaced essentially 90° apart about the resonator axis can be used to drive the resonator at one NMR frequency in either linearly polarized mode or circularly polarized mode, and input/output couplings to one outer structure between and including in inner ring current path and its adjacent outer ring current path and spaced essentially 90° apart about the resonator axis can be used to drive the resonator at a second NMR frequency in either linearly polarized mode or circularly polarized mode or in a combination of the above.

17. The RF resonator of claim 10 in which the outer structures are configured to have a concentrated sinusoidal distribution of currents, a fraction of which flows through the inner structure to produce a highly homogeneous RF $B_1$ field along and in the region of the coil axis.

18. The RF resonator of claim 7 in which a different value of capacitor is employed between each of three pairs of adjacent ring current paths.

19. The RF resonator of claim 18 in which pairs of input/output couplings to an inner structure between and including the inner ring current paths and to outer structure between and including an inner ring current path and its adjacent outer ring current path, each coupler pair spaced essentially 90° apart about the resonator axis can be used to drive the resonator up to a maximum of three NMR frequencies in either linearly polarized mode or circularly polarized mode or in a combination of the above.

20. The RF resonator of claim 14 in which each outer structure between and including an outer ring current path and its adjacent inner ring current path employs unequal value capacitors around the resonator.

21. The RF resonator of claim 20 in which input/output couplings to one outer structure between and including an inner ring path and its adjacent outer ring path and spaced essentially 90° apart about the resonator axis can be used to drive the resonator in linearly polarized mode for up to a maximum of two different NMR frequencies and input/output couplings to the inner structure between and including two inner ring current paths and spaced essentially 90° apart about the resonator axis can be used to drive the resonator in linear polarized mode or in circularly polarized mode at a third NMR frequency.

22. The RF resonator of claim 21 in which the outer structures are configured to have a concentrated sinusoidal distribution of currents, a fraction of which flows through the inner structure to produce a highly homogeneous RF $B_1$ field along and in the region of the coil axis.

23. The RF resonator of claim 14 in which each outer structure between and including an outer ring current path and its adjacent inner ring current path employs unequal value capacitors around the resonator the inner structure between and including two inner ring current paths has unequal value capacitors around the resonator.

24. The RF resonator of claim 23 in which input/output couplings to one outer structure between and including an inner ring current path and its adjacent outer ring current path and spaced essentially 90° apart about the resonator axis can be used to drive the resonator in linearly polarized mode for up to a maximum of two different NMR frequencies, and input/output couplings to the inner structure between and including two inner ring current paths can be used to drive the resonator in linearly polarized mode up to a maximum of two different NMR frequencies.

25. The RF resonator of claim 14 in which the outer structures between and including an outer ring current path and its adjacent inner ring current path employs identical value capacitors and the inner structure between and including two inner ring current paths has unequal value capacitors in its loops.

26. The RF resonator of claim 25 in which input/output couplings to one outer structure between and including an inner ring current path and its adjacent outer ring current path and spaced essentially 90° apart about the resonator axis can be used to drive the resonator in linearly polarized mode or in circularly polarized mode at any one NMR frequency and input/output couplings to the inner structure between and including two inner ring current paths can be used to drive the resonator in linearly polarized mode up to a maximum of two separate NMR frequencies.

27. The RF resonator of claim 1 in which the capacitors in those loops between any two adjacent ring current paths do not have the same value.

28. The RF resonator of claim 27 in which pairs of input/output couplings to an inner structure between and including an inner ring current path and its adjacent outer ring current path and to each outer structure between and including an inner ring current path and its adjacent outer ring current path, each coupler pair being spaced essentially 90° apart about the resonator axis so that the couplers can be used to drive the resonator up to a maximum of six NMR frequencies in linearly polarized mode.

29. A dual RF resonator of generally cylindrical form for use in NMR comprising:
    four coaxial high frequency ring current paths distributed along the axis thereby defined;
    a set of at least four high frequency current paths generally parallel to the axis of the ring current paths connected between pairs of the ring current paths, adjacent parallel high frequency current paths and high frequency ring current paths to which the adjacent parallel paths are connected forming current loops; and
    at least one discrete capacitor interposed in and interrupting each loop, whereby in combination with the inductance in each loop, including inherent inductance in current paths, each loop is resonant, but such that all of the ring current paths are continuously conductive without interruption by a capacitor.

30. The RF resonator of claim 29 in which the resonator has axial symmetry in that the structure in each of the four quadrants around the axis is the same as every other quadrant.

31. The RF resonator of claim 30 in which the resonator has symmetry on both sides of a medial plane normal to the axis of the ring current paths.

32. The RF resonator of claim 29 in which the parallel paths in each set are spaced from one another.

33. The RF resonator of claim 31 in which the parallel paths are equally spaced from one another.

34. The RF resonator of claim 33 in which at least one structure formed by an adjacent pair of ring current paths and interconnecting current paths have capacitors of essentially equal value so that the structure is tuned to one selected NMR frequency whereby input/output couplings to the structure and shaped essentially 90° apart about the resonator axis produce a circularly polarized RF $B_1$ field at that frequency.

35. The RF resonator of claim 33 in which only two values of capacitors are employed, the value of capacitors between any two adjacent pair of ring current paths being equal, and capacitors between each outer ring current path and its adjacent inner ring current path are of equal value.

36. The RF resonator of claim 35 in which input/output couplings to the inner structure formed by the two inner ring current paths and connecting current paths spaced essentially 90° apart about the resonator axis can be used to drive the resonator at one NMR frequency in either linearly polarized mode or circularly polarized mode and input/output couplings to one outer structure between and including an inner ring path and its adjacent outer ring path and spaced essentially 90° apart about the resonator axis, the two outer structures electrically coupled through the inner current paths being tuned to a second NMR frequency, can be used to drive the resonator at a second NMR frequency in either linearly polarized mode or circularly polarized mode.

37. The RF resonator of claim 30 in which each of two structures formed by an adjacent pair of ring current paths and interconnecting current paths equally spaced from one another, and each structure having capacitors of essentially the same value, is resonant at a selected NMR frequency different from the other, whereby for each structure input/output couplings spaced essentially 90° apart about the resonator axis can produce a linearly polarized or a circularly polarized RF $B_1$ field at up to two NMR frequencies.

38. The RF resonator of claim 30 in which two of three structures, each structure formed by an adjacent pair of ring current paths and interconnecting current paths equally spaced from one another and each having capacitors of essentially the same value, electrically coupled to resonate at a selected NMR frequency and the third structure to resonate at a second NMR frequency, whereby input/output couplings to the coupled structures and to the third structure and spaced essentially 90° apart about the resonator axis can produce linearly polarized or circularly polarized RF $B_1$ fields at up to two resonant frequencies.

39. The RF resonator of claim 35 in which the outer structures are configured to have a concentrated sinusoidal distribution of currents, a fraction of which flows through the inner structure to produce a highly homogeneous RF $B_1$ field along and in the region of the coil axis.

40. The RF resonator of claim 29 in which the parallel high frequency current paths between the two middle ring current paths are aligned with high frequency current paths between other ring current paths.

41. The RF resonator of claim 29 in which the parallel high frequency current paths between the two middle ring current paths are connected between the high frequency current paths between other ring current paths.

42. The RF resonator of claim 29 in which there are fewer parallel high frequency current paths between each of the outer ring current paths and adjacent inner ring current paths than between the inner pair of ring current paths.

43. The RF resonator of claim 29 in which there are more parallel high frequency current paths between each of the outer ring current paths and adjacent inner ring current paths than between the inner pair of ring current paths.

44. The RF resonator of claim 42 in which there are half as many parallel high frequency current paths between the respective outer ring current paths and adjacent inner ring current paths than between the inner pair.

45. The RF resonator of claim 44 in which the current paths between the outer ring current paths are aligned with every other current path between the inner ring current paths.

46. The RF resonator of claim 29 in which the current paths which span the middle two ring current paths are not connected thereto but between the two outer ring current paths.

47. An RF resonator for use in NMR comprising:
at least three interconnecting coaxial birdcage coils, each having a pair of high frequency ring current paths, adjacent pairs of which are interconnected by at least four high frequency current paths, adjacent birdcage coils sharing the ring current path between them; and
at least one discrete capacitor interposed in and interrupting each current loop, whereby in combination with the inductance in each loop, including inherent inductance in the conductors, each loop is resonant, but such that each of the ring current paths is continuously conductive without interruption by a capacitor.

48. The RF resonator of claim 13 in which the signals supplied and the coupling arrangement produce counter-rotating current distribution which produces a highly linear gradient in the RF $B_1$ field axially at the center of the resonator.

49. The RF resonator of claim 7 in which the conductive ring current paths are unequally spaced.

50. The RF resonator of claim 49 in which three values of capacitors are employed and the inner structure between and including the two inner pair of ring current paths is tuned to one NMR frequency and the two outer structures between and including an inner ring current path and its adjacent outer ring current path electrically coupled through the inner structure are tuned to a second NMR frequency.

* * * * *